(12) United States Patent
Kishimoto et al.

(10) Patent No.: US 12,111,692 B2
(45) Date of Patent: Oct. 8, 2024

(54) DISPLAY DEVICE INCLUDING A STEP COVERING LAYER

(71) Applicant: SAMSUNG DISPLAY CO., LTD., Yongin-si (KR)

(72) Inventors: Hirotsugu Kishimoto, Hwaseong-si (KR); Da Som Gu, Asan-si (KR); Yun Jae Kim, Cheonan-si (KR); Yong Chan Jeon, Cheonan-si (KR); Hyun Been Hwang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 324 days.

(21) Appl. No.: 17/520,925

(22) Filed: Nov. 8, 2021

(65) Prior Publication Data
US 2022/0147102 A1 May 12, 2022

(30) Foreign Application Priority Data
Nov. 9, 2020 (KR) .......... 10-2020-0148633

(51) Int. Cl.
*G06F 1/16* (2006.01)
(52) U.S. Cl.
CPC .......... *G06F 1/1643* (2013.01); *G06F 1/1616* (2013.01); *G06F 1/1656* (2013.01)
(58) Field of Classification Search
CPC ..... G06F 1/1643; G06F 1/1616; G06F 1/1656
See application file for complete search history.

(56) References Cited

U.S. PATENT DOCUMENTS

| 2020/0389986 | A1* | 12/2020 | Tsuchihashi | .......... G06F 1/1616 |
| 2021/0201710 | A1* | 7/2021 | Kim | .......... G06F 1/1616 |
| 2021/0294379 | A1* | 9/2021 | Lee | .......... G02B 5/3033 |
| 2021/0319724 | A1* | 10/2021 | Jang | .......... G09F 9/301 |
| 2022/0011819 | A1 | 1/2022 | Shin et al. | |
| 2022/0091689 | A1 | 3/2022 | Kishimoto et al. | |

FOREIGN PATENT DOCUMENTS

| KR | 10-2019-0124844 | 11/2019 |
| KR | 10-2020-0084495 | 7/2020 |
| KR | 10-2022-0006669 | 1/2022 |
| KR | 10-2022-0039952 | 3/2022 |

\* cited by examiner

*Primary Examiner* — Kenneth B Lee, Jr.
(74) *Attorney, Agent, or Firm* — F. CHAU & ASSOCIATES, LLC

(57) ABSTRACT

A display device includes: a display panel including a folding area and a first non-folding area extended from a first folding line located on a first side of the folding area; a digitizer layer disposed on the display panel and including electrode patterns; and a step covering layer disposed between the display panel and the digitizer layer, wherein the step covering layer includes a first metal plate, a second metal plate, and a first non-metal plate, wherein the first metal plate overlaps the folding area, wherein the second metal plate overlaps the first non-folding area, and wherein the first non-metal plate overlaps the first non-folding area and is disposed on a first surface of the second metal plate.

21 Claims, 31 Drawing Sheets

DISPLAY DEVICE INCLUDING A STEP COVERING LAYER

CROSS-REFERENCE TO RELATED APPLICATION

This application claims priority under 35 U.S.C. § 119 to Korean Patent Application No. 10-2020-0148633 filed on Nov. 9, 2020, in the Korean Intellectual Property Office, the disclosure of which is incorporated by reference herein in its entirety.

TECHNICAL FIELD

The present invention relates to a display device, and more particularly, to a display device including a step covering layer.

DISCUSSION OF THE RELATED ART

As the information-oriented society evolves, various desires for display devices are ever increasing. For example, display devices are being employed by a variety of electronic devices such as smart phones, digital cameras, laptop computers, navigation devices, and smart televisions.

Recently, there is a desire for a flexible display device that provides a wide display screen while increasing the portability or space utilization of the display device by using, for example, a flexible material. For example, a bendable display device, in which the display area can be bent, a rollable display device, in which the display area can be rolled, and a foldable display device, in which the display area can be folded are currently under development. In addition, recent display devices support touch input using an electronic pen (e.g., a stylus pen) as well as a touch input using a part of a user's body (e.g., a finger). By using a touch input with an electronic pen, the display device can sense the touch input more precisely than a display device using only a touch input by a part of the user's body. In addition, typically, a digitizer layer for sensing a touch input by an electronic pen includes circuit lines which have level differences, and thus a protective film disposed on the digitizer layer may have an uneven shape. Accordingly, the uneven shape of the protective film due to the level differences of the lines of the digitizer layer may be recognized by a user viewing the front of the display device when high luminance light is illuminated to the front of the display device while no image is displayed thereon.

SUMMARY

According to an embodiment of the present invention, a display device includes: a display panel including a folding area and a first non-folding area extended from a first folding line located on a first side of the folding area; a digitizer layer disposed on the display panel and including electrode patterns; and a step covering layer disposed between the display panel and the digitizer layer, wherein the step covering layer includes a first metal plate, a second metal plate, and a first non-metal plate, wherein the first metal plate overlaps the folding area, wherein the second metal plate overlaps the first non-folding area, and wherein the first non-metal plate overlaps the first non-folding area and is disposed on a first surface of the second metal plate.

In an embodiment of the present invention, a thickness of the second metal plate is smaller than a thickness of the first metal plate.

In an embodiment of the present invention, the thickness of the second metal plate is about 20% to about 70% of the thickness of the first metal plate.

In an embodiment of the present invention, the first non-metal plate is disposed between the display panel and the second metal plate.

In an embodiment of the present invention, a thickness of the step covering layer is constant across the folding area and the first non-folding area.

In an embodiment of the present invention, the first metal plate includes a plurality of bars overlapping the folding area.

In an embodiment of the present invention, the first metal plate includes a slit formed between adjacent ones of the plurality of bars.

In an embodiment of the present invention, a width of each of the plurality of bars in a direction is smaller than or equal to a width of the slit in the direction.

In an embodiment of the present invention, the first metal plate includes a plurality of first holes overlapping the folding area, and wherein the second metal plate includes a plurality of second holes overlapping the first non-folding area.

In an embodiment of the present invention, a direction in which the plurality of first holes is extended is different from a direction in which the plurality of second holes is extended.

In an embodiment of the present invention, the direction in which the plurality of first holes is extended is parallel to a direction in which the first folding line is extended, and wherein the direction in which the plurality of second holes is extended is substantially perpendicular to the direction in which the first folding line is extended.

In an embodiment of the present invention, the second metal plate includes a plurality of second holes overlapping the first non-folding area, and wherein the first non-metal plate includes first protrusions disposed in the plurality of second holes of the second metal plate, respectively.

In an embodiment of the present invention, the display panel further includes a second non-folding area extended from a second folding line located on a second side of the folding area opposite to the first side of the folding area, and wherein the step covering layer includes: a third metal plate overlapping the second non-folding area, and a second non-metal plate overlapping the second non-folding area and disposed on a first surface of the third metal plate.

In an embodiment of the present invention, a thickness of the third metal plate is smaller than a thickness of the first metal plate.

In an embodiment of the present invention, a thickness of the first non-metal plate is equal to a thickness of the second non-metal plate.

In an embodiment of the present invention, the third metal plate includes a plurality of third holes overlapping the second non-folding area, and wherein the second non-metal plate includes second protrusions disposed in the plurality of third holes of the third metal plate, respectively.

In an embodiment of the present invention, the step covering layer includes a third non-metal plate overlapping the first non-folding area and disposed on a second surface of the second metal plate opposite to the first surface of the second metal plate.

In an embodiment of the present invention, the step covering layer includes a fourth non-metal plate overlapping the second non-folding area and disposed on a second surface of the third metal plate opposite to the first surface of the third metal plate.

In an embodiment of the present invention, the first non-metal plate is disposed between the display panel and the digitizer layer.

According to an embodiment of the present invention, a display device includes: a display panel displaying an image; a digitizer layer disposed on a rear surface of the display panel and including electrode patterns; and a step covering layer disposed between the display panel and the digitizer layer, wherein the step covering layer includes: a metal plate, and a non-metal plate disposed on at least a part of a surface of the metal plate, and wherein a first thickness of the metal plate is larger than a first thickness of the non-metal plate.

BRIEF DESCRIPTION OF THE DRAWINGS

The above and other features of the present invention will become more apparent by describing in detail embodiments thereof with reference to the attached drawings, in which.

DETAILED DESCRIPTION OF THE EMBODIMENTS

Figure 1:
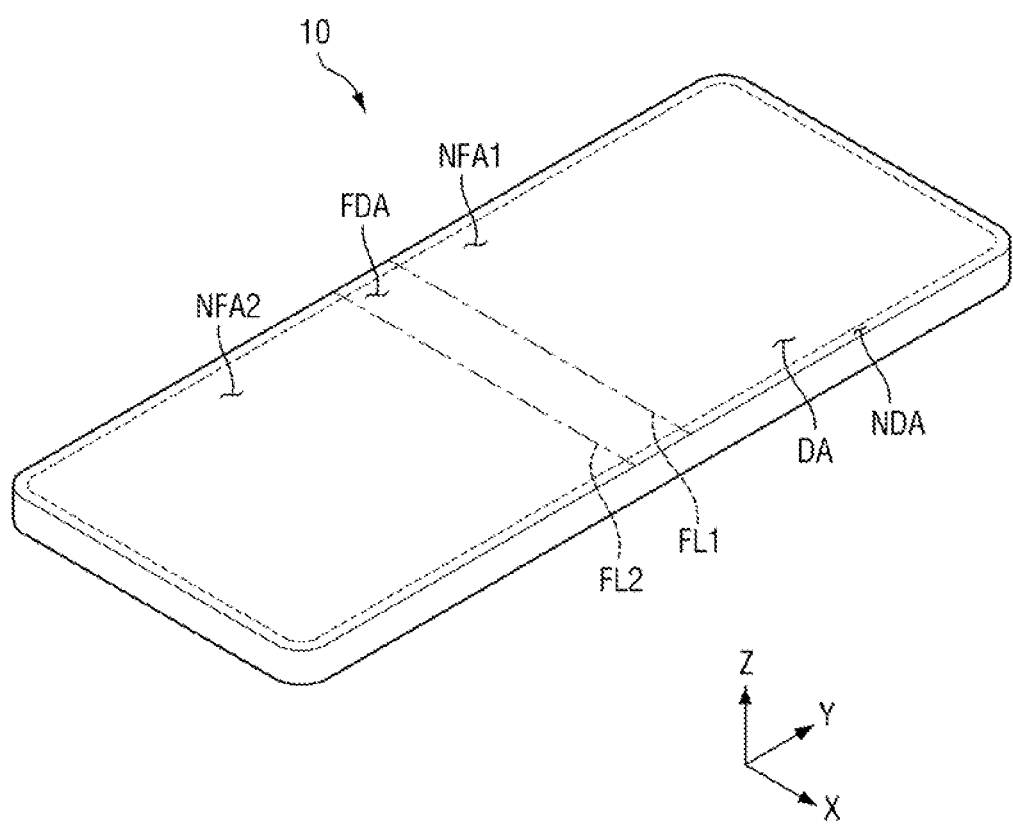
FIGS. 1 and 2 are perspective views illustrating a display device according to an embodiment of the present invention.

The invention now will be described more fully hereinafter with reference to the accompanying drawings. This invention may, however, be embodied in many different forms, and should not be construed as limited to the embodiments set forth herein. Like reference numerals may refer to like elements throughout the specification.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It will be further understood that descriptions of features or aspects within each embodiment may be applicable to other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that the terms "first," "second," "third," etc. are used herein to distinguish one element from another, and the elements are not limited by these terms. Thus, a "first" element described below may be termed a "second" element. The description of an element as a "first" element may not require or imply the presence of a second element or other elements. The terms "first", "second", etc. may also be used herein to differentiate different categories or sets of elements. For example, for conciseness, the terms "first", "second", etc. may represent "first-category (or first-set)", "second-category (or second-set)", etc., respectively.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. Further, it is to be understood that while parameters may be described herein as having "about" a certain value, according to an embodiment, the parameter may be exactly the certain value or approximately the certain value within a measurement error as would be understood by a person having ordinary skill in the art.

Hereinafter, embodiments of the present invention will be described in detail with reference to the accompanying drawings.

Figure 2:
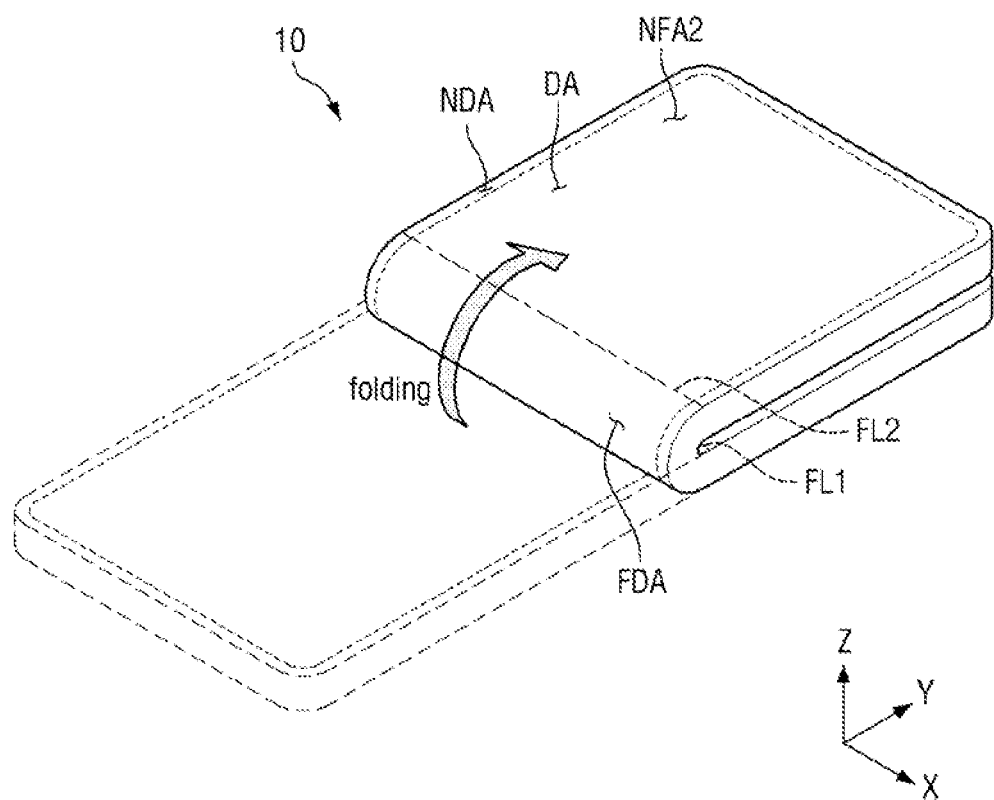

FIGS. 1 and 2 are perspective views illustrating a display device according to an embodiment of the present invention. FIG. 1 is a perspective view of a display device according to an embodiment of the present invention when it is unfolded. FIG. 2 is a perspective view of the display device according to the embodiment of the present invention when it is folded.

As shown in FIGS. 1 and 2, a first direction (e.g., an x-axis direction) may refer to a direction parallel to a side of the display device 10, for example, the horizontal direction of the display device 10 when viewed from the top. A second direction (e.g., a y-axis direction) may refer to a direction parallel to another side of the display device 10 that meets the side of the display device 10, for example, the vertical direction of the display device 10 when viewed from the top. A third direction (e.g., a z-axis direction) may refer to the thickness direction of the display device 10.

The display device 10 may have, for example, a rectangular shape or a square shape when viewed from the top. The display device 10 may have a rectangular shape with sharp corners or a rectangular shape with rounded corners when viewed from the top. The display device 10 may include two shorter sides extended in the first direction (e.g., the x-axis direction) and two longer sides extended in the second direction (e.g., the y-axis direction) when viewed from the top.

The display device 10 includes a display area DA and a non-display area NDA. The shape of the display area DA may conform to the shape of the display device 10 when viewed from the top. For example, when the display device 10 is rectangular when viewed from the top, the display area DA may also be rectangular.

The display area DA may include a plurality of pixels to display images. The plurality of pixels may be arranged in a matrix pattern. The plurality of pixels may be, but is not limited to, a rectangle, a diamond, or a square when viewed from the top. For example, the plurality of pixels may be a quadrangle, a polygon, a circle, or an ellipse when viewed from the top.

The non-display area NDA may not include pixels and thus might not display images. The non-display area NDA may be disposed around the display area DA. For example, the non-display area NDA may be disposed to surround the display area DA as shown in FIGS. 1 and 2, but the present invention is not limited thereto. For example, the display area DA may be partially surrounded by the non-display area NDA.

The display device 10 may be folded and unfolded. The display device 10 may be folded inward (e.g., in-folding manner) so that the display device DA is located inside, as shown in FIG. 2. When the display device 10 is folded in the in-folding manner, a part of the front surface of the display device 10 may face another part of the front surface. In addition, the display device 10 may be folded outward (e.g., an out-folding manner) so that the display area DA is located outside. When the display device 10 is folded in the out-folding manner, a part of the rear surface of the display device 10 may face another part of the rear surface.

The display device 10 may include a folding area FDA, a first non-folding area NFA1, and a second non-folding area NFA2. The display device 10 can be bent or folded at the folding area FDA, while it cannot be bent or folded at the first non-folding area NFA1 and the second non-folding area NFA2.

The first non-folding area NFA1 may be disposed on one side of the folding area FDA, for example, the upper side of the folding area FDA. The second non-folding area NFA2 may be disposed on another side of the folding area FDA, for example, the lower side of the folding area FDA. For example, the upper side of the folding area FDA may be opposite to the lower side of the folding area FDA. The folding area FDA may be defined by the first folding line FL1 and the second folding line FL2 and may be bent with a predetermined curvature. The first folding line FL1 may be the boundary between the folding area FDA and the first non-folding area NFA1, and the second folding line FL2 may be the boundary between the folding area FDA and the second non-folding area NFA2. For example, the first folding line FL1 may be opposite to the second folding line FL2.

The first folding line FL1 and the second folding line FL2 may be extended in the first direction (e.g., the x-axis direction) as shown in FIGS. 1 and 2, and the display device 10 may be folded in the second direction (e.g., the y-axis direction). As a result, the length of the display device 10 in the second direction (e.g., the y-axis direction) may be reduced to about half, so that the display device 10 is easy to carry.

When the first folding line FL1 and the second folding line FL2 are extended in the first direction (e.g., the x-axis direction) as shown in FIGS. 1 and 2, the length of the folding area FDA in the second direction (e.g., the y-axis direction) may be smaller than the length in the first direction (e.g., the x-axis direction). In addition, the length of the first non-folding area NFA1 in the second direction (e.g., the y-axis direction) may be larger than the length of the first non-folding area NFA1 in the first direction (e.g., the x-axis direction). The length of the second non-folding area NFA2 in the second direction (e.g., the y-axis direction) may be larger than the length of the second non-folding area NFA2 in the first direction (e.g., the x-axis direction).

Each of the display area DA and the non-display area NDA may overlap at least one of the folding area FDA, the first non-folding area NFA1, and/or the second non-folding area NFA2. In the example shown in FIGS. 1 and 2, each of the display area DA and the non-display area NDA overlaps the folding area FDA, the first non-folding area NFA1 and the second non-folding area NFA2.

Figure 3:
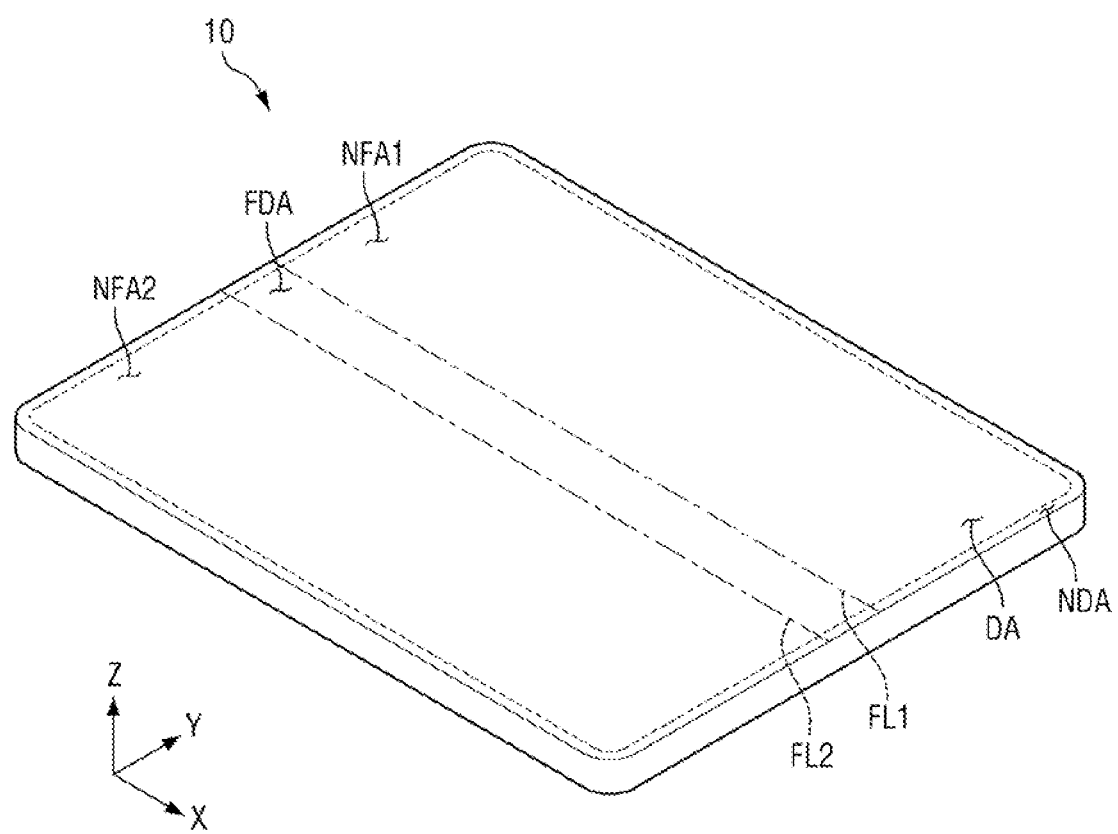
FIGS. 3 and 4 are perspective views illustrating a display device according to an embodiment of the present invention.
Figure 4:
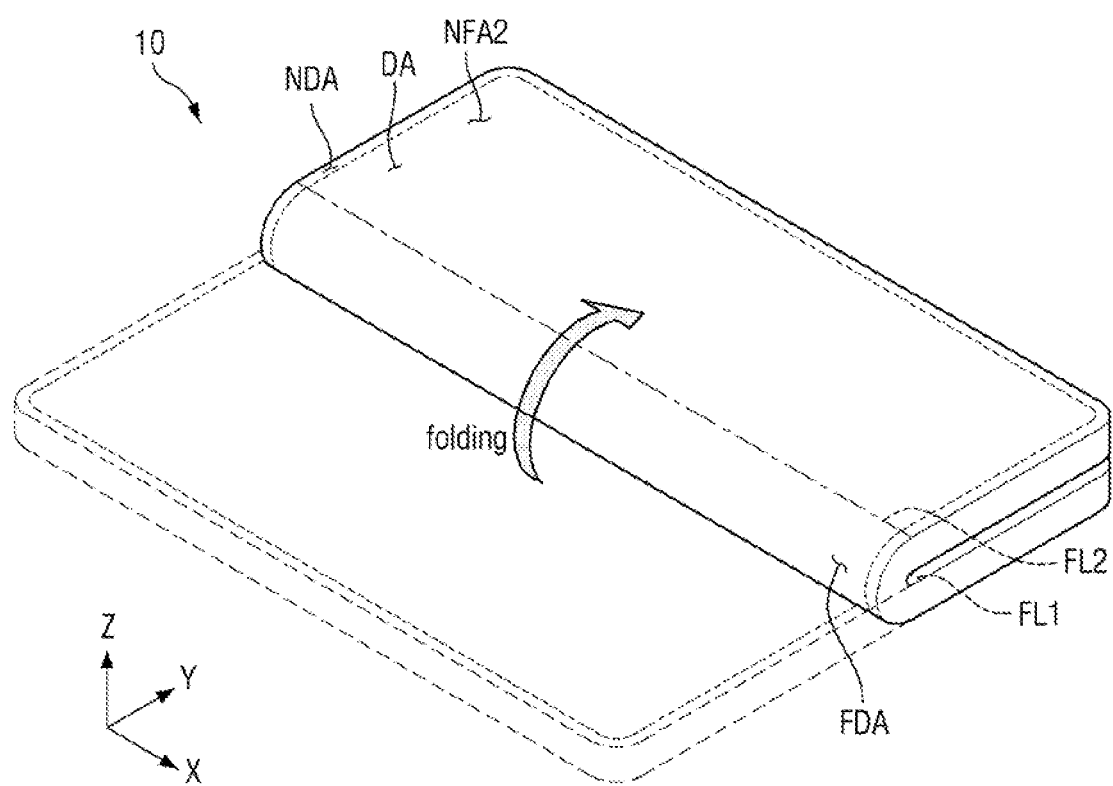

FIGS. 3 and 4 are perspective views illustrating a display device according to an embodiment of the present invention. FIG. 3 is a perspective view of a display device according to an embodiment of the present invention when it is unfolded. FIG. 4 is a perspective view of the display device according to the embodiment of the present invention when it is folded.

The embodiment of FIGS. 3 and 4 is substantially identical to the embodiment of FIGS. 1 and 2 except that a first folding line FL1 and a second folding line FL2 extend in the second direction (e.g., the y-axis direction) and the display device 10 can be folded in the first direction (e.g., the x-axis direction), so that the length of the display device 10 in the first direction (e.g., the x-axis direction) can be reduced by approximately half, which is convenient for the user to carry the display device 10. Therefore, the embodiment of FIGS. 3 and 4 will not be described.

Figure 5:
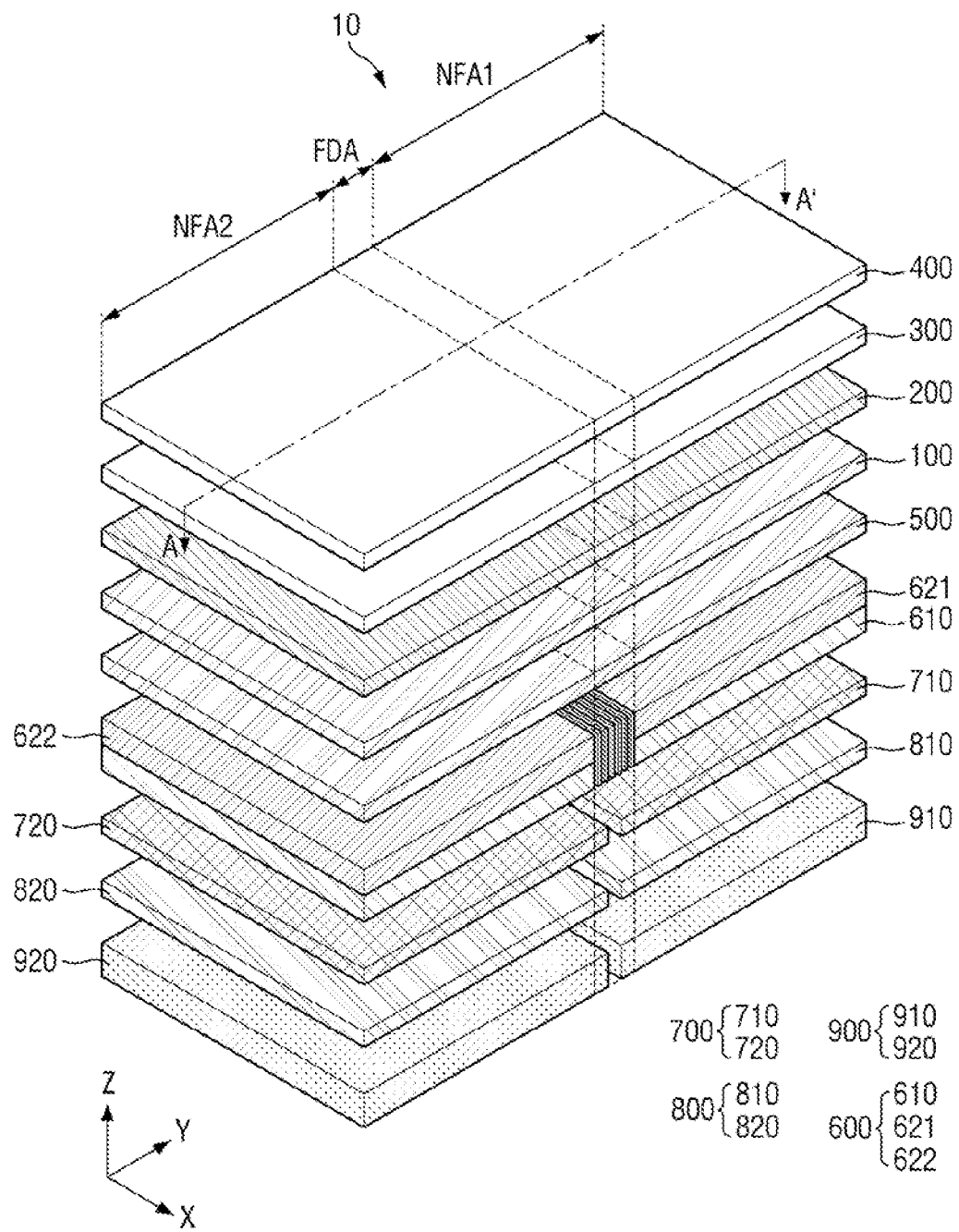
FIG. 5 is an exploded perspective view of the display device shown in FIG. 1.
Figure 6:
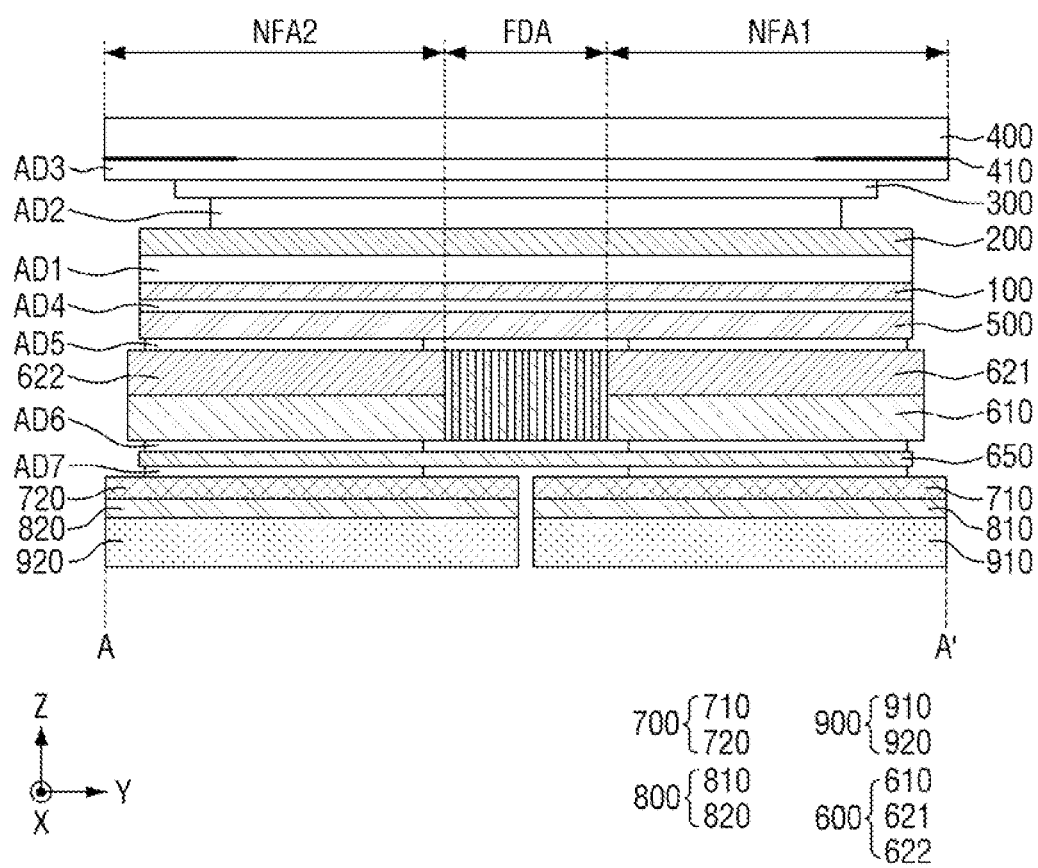
FIG. 6 is a cross-sectional view illustrating the display device taken along line A-A' of FIG. 5.

FIG. 5 is an exploded perspective view of an example of the display device shown in FIG. 1. FIG. 6 is a cross-sectional view showing an example of the display device taken along line A-A' of FIG. 5.

Referring to FIGS. 5 and 6, a display device 10 according to an embodiment of the present invention includes a display panel 100, a polarizing film 200, a window 300, a window protective film 400, a panel protective film 500, a step covering layer 600, a digitizer layer 700, a shielding member 800, and a heat dissipation member 900.

Examples of the panel displaying images may include an organic light-emitting display panel using organic light-emitting diodes, a quantum-dot light-emitting display panel including a quantum-dot light-emitting layer, an inorganic light-emitting display panel including an inorganic semiconductor, and a micro light-emitting display panel using micro light-emitting diodes (LED). In the following description, an organic light-emitting display panel is employed as the display panel 100, as an example. It is, however, to be understood that the present invention is not limited thereto. The display panel 100 will be described in more detail with reference to FIG. 7.

The polarizing film 200 may be disposed on the display panel 100. For example, the polarizing film 200 may be disposed on the front surface of the display panel 100. The front surface of the display panel 100 may be a display surface where images are displayed. The polarizing film 200 may be attached to the front surface of the display panel 100 by a first adhesive member AD1. For example, the first adhesive member 910 may be an optically clear adhesive (OCA) film or an optically clear resin (OCR). The polarizing film 200 may include, for example, a linear polarizer and a retardation film such as a λ/4 (quarter-wave) plate.

The window 300 may be disposed on the polarizing film 200. For example, the window 200 may be disposed on the front surface of the polarizing film 200. The window 300 may be attached to the front surface of the polarizing film 200 by a second adhesive member AD2. For example, the second adhesive member AD2 may be a transparent adhesive film or a transparent adhesive resin. The window 300 may be made of a transparent material, and may include, for example, glass or plastic. For example, the window 300 may be, but is not limited to, an ultra thin glass (UTG) having a thickness of about 0.1 mm or less or a transparent polyimide film.

The window protective film 400 may be disposed on the window 300. For example, the window protective film 400 may be disposed on the front surface of the window 300. The window protective film 400 may be attached to the front surface of the window 300 by a third adhesive member AD3. For example, the third adhesive member AD3 may be a transparent adhesive film or a transparent adhesive resin. The window protective film 400 may perform at least one of functions of anti-scattering when the cover window 400 is broken, shock absorption, anti-scratch, anti-fingerprint, and anti-glare.

A light-blocking layer 410 may be disposed on the window protective film 400. For example, a light-blocking 410 may be disposed on the rear surface of the window protective film 400. The light-blocking layer 410 may be disposed on the edge of the window protective film 400. The light-blocking layer 410 may include a material that can block light. For example, the light-blocking layer 410 may include an inorganic black pigment such as carbon black or an organic black pigment.

The panel protective film 500 may be disposed on the display panel 100. For example, the panel protective film 500 may be disposed the rear surface of the display panel 100. The panel protective film 500 may be attached to the rear surface of the display panel 100 by a fourth adhesive member AD4. The fourth adhesive member AD4 may be, for example, a pressure sensitive adhesive (PSA). The panel protective film 500 can support the display panel 100 and protect the rear surface of the display panel 100. The panel protective film 500 may be a plastic film such as polyethylene terephthalate (PET) or glass.

Although the panel protective film 500 is disposed in the folding area FDA in the example shown in FIGS. 5 and 6, the present invention is not limited thereto. For example, the panel protective film 500 may be removed from the folding area FDA so that the display device 10 can be folded smoothly.

The step covering layer 600 may be disposed on the panel protective film 500. For example, the step covering layer 600 may be disposed on the rear surface of the panel protective film 500. The step covering layer 600 may be attached to the rear surface of the panel protective film 500 by fifth adhesive members AD5. The fifth adhesive members AD5 may not be disposed in the folding area FDA to reduce the folding stress of the display device 10. One of the fifth adhesive members AD5 may be disposed in the first non-folding area NFA1, and another one may be disposed in the second non-folding area NFA2. For example, the fifth adhesive members AD5 may be pressure sensitive adhesives.

The step covering layer 600 may be disposed on the panel protective film 500. For example, the step covering layer 600 may be disposed on the rear surface of the panel protective film 500 to support the display panel 100 together with the panel protective film 500 and can protect the rear surface of the display panel 100. The step covering layer 600 may be disposed on the front surface of the digitizer layer 700 to support the digitizer layer 700 and can protect the front surface of the digitizer layer 700.

The step covering layer 600 may include a metal plate 610, a first non-metal plate 621 disposed in the first non-folding area NFA1, and a second non-metal plate 622 disposed in the second non-folding area NFA2. The metal plate 610 may include, for example, SUS (Steel Use Stainless), which is an alloy including iron, chromium, nickel, manganese, etc. Each of the first non-metal plate 621 and the second non-metal plate 622 may include a non-metallic material such as glass, ceramic, plastic, carbon fiber, and a polymer including glass fiber. When each of the first non-metal plate 621 and the second non-metal plate 622 includes carbon fiber, the polymer may be epoxy, polyester, polyamide, polycarbonate, polypropylene, polybutylene, or vinyl ester. When the first non-metal plate 621 and the second non-metal plate 622 include glass fiber, the polymer may be epoxy, polyester, polyamide, or vinyl ester. When the first non-metal plate 621 and the second non-metal plate 622 include plastic, the plastic may include polymethyl methacrylate (PMMA) that is light, has good durability, and is easy to process.

The step covering layer 600 may include a hard or rigid material such that its shape or volume does not change easily due to external pressure. To this end, the thickness of the step covering layer 600 may be, but is not limited to, approximately 100 μm to approximately 300 μm. The thickness of the step covering layer 600 may be larger than the thickness of the digitizer layer 700 and/or the thickness of the shielding member 800. In addition, the thickness of the step covering layer 600 may be larger than the thickness of the display panel 100.

The step covering layer 600 will be described in more detail with reference to FIG. 10.

A buffer member 650 may be disposed on the step covering layer 600. For example, the buffer member 650 may be disposed on the rear surface of the step covering layer 600. The buffer member 650 may be attached to the rear surface of the step covering layer 600 by sixth adhesive members AD6. The sixth adhesive members AD6 might not be disposed in the folding area FDA to reduce the folding stress of the display device 10. One of the sixth adhesive members AD6 may be disposed in the first non-folding area NFA1, and another one may be disposed in the second non-folding area NFA2. For example, the sixth adhesive members AD6 may be pressure sensitive adhesives.

The buffer member 650 absorbs external impact to prevent damage to the step covering layer 600 and the digitizer layer 700. For example, the buffer member 650 may include an elastic material such as a rubber and a sponge formed by foaming a urethane-based material or an acrylic-based material.

The digitizer layer 700 includes a first digitizer layer 710 and a second digitizer layer 720. The first digitizer layer 710 and the second digitizer layer 720 may be disposed on the rear surface of the buffer member 650. The first digitizer layer 710 and the second digitizer layer 720 may be attached to the rear surface of the buffer member 650 by seventh adhesive members AD7. For example, the seventh adhesive members AD7 may be pressure sensitive adhesives.

The first digitizer layer 710, the second digitizer layer 720 and the seventh adhesive members AD7 might not be disposed in the folding area FDA to reduce the folding stress of the display device 10. The first digitizer layer 710 and one of the seventh adhesive members AD7 may be disposed in the first non-folding area NFA1, and the second digitizer layer 720 and another one of the seventh adhesive members AD7 may be disposed in the second non-folding area NFA2. For example, a gap between the first digitizer layer 710 and the second digitizer layer 720 may overlap the folding area FDA and may be smaller than the width of the folding area FDA. The width of the folding area FDA may extend in the second direction (e.g., the y-axis direction).

The first digitizer layer 710 and the second digitizer layer 720 include electrode patterns for sensing proximity or contact of an electronic pen such as a stylus pen supporting an electromagnetic resonance (EMR) technology. The first digitizer layer 710 and the second digitizer layer 720 may detect a magnetic field or an electromagnetic signal emitted from the electronic pen based on the electrode patterns, and may determine touch coordinates of the point where the detected magnetic field or electromagnetic signal is largest. The digitizer layer 700 will be described later with reference to FIGS. 9 and 10.

The shielding member 800 includes a first shielding member 810 and a second shielding member 820. The first shielding member 810 and the second shielding member 820 may be disposed on the rear surface of the digitizer layer 700.

The first shielding member 810 and the second shielding member 820 might not be disposed in the folding area FDA to reduce folding stress of the display device 10. However, the present invention is not limited thereto, and for example, the first shielding member 810 and the second shielding member 820 may be at least partially disposed in the folding area FDA. The first shielding member 810 may be disposed in the first non-folding area NFA1, and the second shielding member 820 may be disposed in the second non-folding area NFA2. A gap between the first shielding member 810 and the second shielding member 820 may overlap the folding area FDA and may be smaller than the width of the folding area FDA.

The first shielding member 810 and the second shielding member 820 may include magnetic metal powders, so that a magnetic field or an electromagnetic signal that has passed through the digitizer layer 700 can flow in the first shielding member 810 and the second shielding member 820. Therefore, the first shielding member 810 and the second shielding member 820 can suppress the magnetic field or electromagnetic signal from being emitted through the rear surface of the display device 10.

The heat dissipation member 900 includes a first heat dissipation member 910 and a second heat dissipation member 920. The first heat dissipation member 910 and the second heat dissipation member 920 may be disposed on the rear surface of the shielding member 800.

The first heat dissipation member 910 and the second heat dissipation member 920 might not be disposed in the folding area FDA to reduce folding stress of the display device 10. However, the present invention is not limited thereto, and for example, the first heat dissipation member 910 and the second heat dissipation member 920 may be at least partially disposed in the folding area FDA. The first heat dissipation member 910 may be disposed in the first non-folding area NFA1, and the second heat dissipation member 920 may be disposed in the second non-folding area NFA2. A gap between the first heat dissipation member 910 and the second heat dissipation member 920 may overlap the folding area FDA and may be smaller than the width of the folding area FDA.

The first heat dissipation member 910 and the second heat dissipation member 920 may be metal films such as copper alloy, copper, nickel, ferrite and silver, which have excellent thermal conductivity. Accordingly, heat generated by the display device 10 can be released to the outside by the first heat dissipation member 910 and the second heat dissipation member 920.

As shown in FIG. 6, the step covering layer 600 is disposed on the digitizer layer 700 and the shielding member 800, and includes a hard or rigid material such that its shape or volume is not easily changed by external pressure, so that the step covering layer 600 does not have an uneven shape (or, e.g., uneven surfaces) even if there are level differences in the electrode patterns of the digitizer layer 700. Therefore, the panel protective film 500 disposed on the step covering layer 600 may not have an uneven shape, either. Therefore, it is possible to prevent an uneven shape (or, e.g., uneven surfaces) of the panel protective film 500 due to the level differences of the lines of the digitizer layer 700, and accordingly, possibly prevent the uneven shape from being recognized by the user on the front of the display device when high luminance light is illuminated to the front of the display device while no image is displayed thereon.

Figure 7:
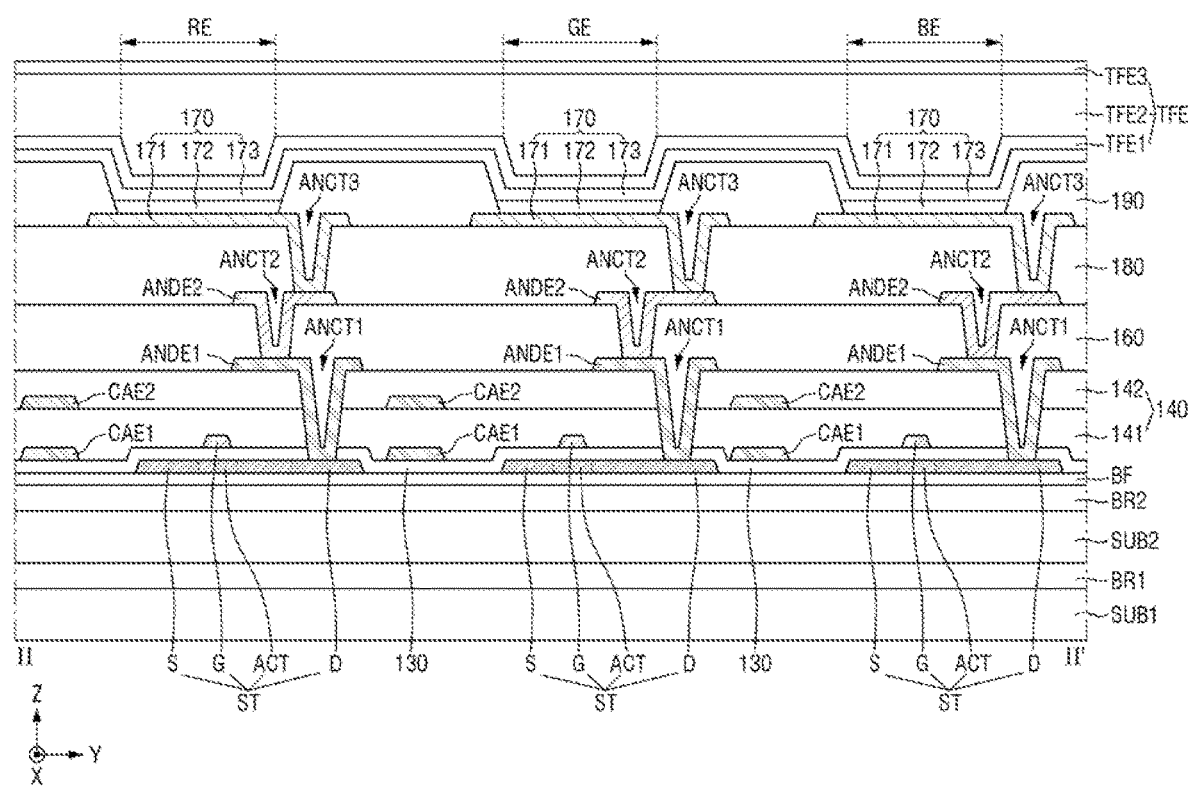
FIG. 7 is a cross-sectional view illustrating the display panel of FIG. 6.

FIG. 7 is a cross-sectional view illustrating an example of the display panel of FIG. 6. FIG. 7 shows an example of the cross section of a display area of the display panel.

Referring to FIG. 7, a first barrier film BR1 may be disposed on a first substrate SUB1, and a second substrate SUB2 may be disposed on the first barrier film BR1. Further, a second buffer film BF2 may be disposed on the second substrate SUB2.

Each of the first substrate SUB1 and the second substrate SUB2 may be made of an insulating material such as a polymer resin. For example, the first substrate SUB1 and the second substrate SUB2 may include polyimide. Each of the first substrate SUB1 and the second substrate SUB2 may be a flexible substrate that can be bent, folded, rolled, and so on.

Each of the first barrier film BR1 and the second barrier film BR2 is a layer for protecting the thin-film transistors of the thin-film transistor layer and an emissive layer 172 of an emission material layer from moisture permeating through the first substrate SUB1 and the second substrate SUB2, which are vulnerable to moisture permeation. Each of the first barrier film BR1 and the second barrier film BR2 may be made up of multiple inorganic films alternately stacked on one another. For example, each of the first and second barrier films BR1 and BR2 may be made up of multiple layers in which one or more inorganic layers of, for example, a silicon nitride layer, a silicon oxynitride layer, a silicon oxide layer, a titanium oxide layer and/or an aluminum oxide layer are alternately stacked on one another.

A buffer film BF may be disposed on the second barrier film BR2. The buffer film BF may be formed of at least one inorganic film. For example, the buffer film BF may include one or more inorganic films of, for example, a silicon nitride layer, a silicon oxynitride layer, a silicon oxide layer, a titanium oxide layer and/or an aluminum oxide layer.

A thin-film transistor ST may be disposed on the buffer film BF. The thin-film transistor ST may include an active layer ACT, a gate electrode G, a source electrode S, and a drain electrode D.

The active layer ACT, the source electrode S and the drain electrode D may be disposed on the buffer film BF. For example, the active layer ACT may include polycrystalline silicon, single crystal silicon, low-temperature polycrystalline silicon, amorphous silicon, or an oxide semiconductor. The source electrode S and the drain electrode S may have conductivity by doping a silicon semiconductor or an oxide semiconductor with ions or impurities. The active layer ACT may overlap the gate electrode G in the third direction (e.g., the z-axis direction), and the source electrode S and the drain electrode D may not overlap the gate electrode G in the third direction (e.g., the z-axis direction).

A gate insulator 130 may be disposed on the active layer ACT, the source electrode S and the drain electrode D of the thin-film transistor ST. The gate insulator 130 may be formed of an inorganic layer, for example, a silicon nitride layer, a silicon oxynitride layer, a silicon oxide layer, a titanium oxide layer, and/or an aluminum oxide layer.

The gate electrode G and a first capacitor electrode CAE1 may be disposed on the gate insulator 130. The gate electrode G may overlap the active layer ACT in the third direction (e.g., the z-axis direction). The first capacitor electrode CAE1 may overlap the second capacitor electrode CAE2 in the third direction (e.g., the z-axis direction). The gate electrode G and the first capacitor electrode CAE1 may each include a single layer or multiple layers of at least one of molybdenum (Mo), aluminum (Al), chromium (Cr), gold (Au), titanium (Ti), nickel (Ni), neodymium (Nd) and copper (Cu) or an alloy thereof.

The first interlayer dielectric layer 141 may be disposed on the gate electrode G and the first capacitor electrode CAE1. The first interlayer dielectric layer 141 may be formed of an inorganic layer, for example, a silicon nitride layer, a silicon oxynitride layer, a silicon oxide layer, a titanium oxide layer, and/or an aluminum oxide layer. The first interlayer dielectric layer 141 may include a number of inorganic layers.

The second capacitor electrode CAE2 may be disposed on the first interlayer dielectric layer 141. The second capacitor electrode CAE2 may overlap the first capacitor electrode CAE1 in the third direction (e.g., the z-axis direction). Since the first interlayer dielectric layer 141 has a predetermined dielectric constant, a capacitor can be formed by the first capacitor electrode CAE1, the second capacitor electrode CAE2 and the first interlayer dielectric layer 141 disposed therebetween. The second capacitor electrode CAE2 may include a single layer or multiple layers of at least one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be disposed over the second capacitor electrode CAE2. The second interlayer dielectric layer 142 may be formed of an inorganic layer, for example, a silicon nitride layer, a silicon oxynitride layer, a silicon oxide layer, a titanium oxide layer, and/or an aluminum oxide layer. The second interlayer dielectric layer 142 may include a number of inorganic layers.

A first anode connection electrode ANDE1 may be disposed on the second interlayer dielectric layer 142. The first anode connection electrode ANDE1 may be connected to the drain electrode D through a first anode contact hole ANCT1 that penetrates the first interlayer dielectric layer 141 and the second interlayer dielectric layer 142 to expose the drain electrode D. The first anode connection electrode ANDE1 may include a single layer or multiple layers of at least one of molybdenum (Mo), aluminum (Al), chromium (Cr), gold (Au), titanium (Ti), nickel (Ni), neodymium (Nd) and copper (Cu) or an alloy thereof.

A first organic layer 160 may be disposed on the first anode connection electrode ANDE1 for planarization. The first organic layer 160 may be formed as an organic layer such as an acryl resin, an epoxy resin, a phenolic resin, a polyamide resin and a polyimide resin.

A second anode connection electrode ANDE2 may be disposed on the first organic layer 160. The second anode connection electrode ANDE2 may be connected to the first anode connection electrode ANDE1 through a second anode contact hole ANCT2 that penetrates through the first organic layer 160 to expose the first anode connection electrode ANDE1. The second anode connection electrode ANDE2 may include a single layer or multiple layers of at least one of molybdenum (Mo), aluminum (Al), chromium (Cr), gold (Au), titanium (Ti), nickel (Ni), neodymium (Nd) and copper (Cu) or an alloy thereof.

A second organic layer 180 may be disposed on the second anode connection electrode ANDE2. The second organic layer 180 may be formed as an organic layer such as an acryl resin, an epoxy resin, a phenolic resin, a polyamide resin and a polyimide resin.

In FIG. 7, the thin-film transistor ST is implemented as a top-gate transistor in which the gate electrode G is located above the active layer ACT. It is, however, to be understood that the present invention is not limited thereto. For example, the thin-film transistor ST may be implemented as a bottom-gate transistor in which the gate electrode G is located below the active layer ACT, or as a double-gate transistor in which the gate electrodes G are disposed above and below the active layer ACT.

Light-emitting elements 170 and a bank 190 may be disposed on the second organic layer 180. Each of the light-emitting elements 170 may include a first light-emitting electrode 171, an emissive layer 172, and a second light-emitting electrode 173.

The first light-emitting electrode 171 may be formed on the second organic layer 180. The first light-emitting electrode 171 may be connected to the second anode connection electrode ANDE2 through a third anode contact hole ANCT3 that penetrates through the second organic layer 180 to expose the second anode connection electrode ANDE2.

In the top-emission organic light-emitting diode that light exits from the emissive layer 172 toward the second light-emitting electrode 173, the first light-emitting electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The bank 190 may partition the first light-emitting electrode 171 on the second organic layer 180 to serve to form emission areas RE, GE and BE. The bank 190 may be formed to cover the edge of the first light-emitting electrode 171. The bank 190 may be formed of an organic layer such as an acryl resin, an epoxy resin, a phenolic resin, a polyamide resin and a polyimide resin.

In each of the emission zones RE, GE and BE, the first light-emitting electrode 171, the emissive layer 172 and the second light-emitting electrode 173 are stacked on one another sequentially, so that holes from the first light-emitting electrode 171 and electrons from the second light-emitting electrode 173 are combined with each other in the emissive layer 172 to emit light.

The emissive layer 172 is formed on the first light-emitting electrode 171 and the bank 190. The emissive layer 172 may include an organic material and emit light of a certain color. For example, the emissive layer 172 may include a hole transporting layer, an organic material layer, and an electron transporting layer.

The second light-emitting electrode 173 is formed on the emissive layer 172. The second light-emitting electrode 173 may be formed to cover the emissive layer 172. The second light-emitting electrode 173 may be a common layer formed across the emission areas RE, GE and BE. A capping layer may be formed on the second light-emitting electrode 173.

In the top-emission organic light-emitting diode, the second light-emitting electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the second light-emitting electrode 173 is formed of a semi-transmissive conductive material, the light extraction efficiency can be increased by using microcavities.

An encapsulation layer TFE may be disposed on the second light-emitting electrode 173. The encapsulation layer TFE may include at least one inorganic film to prevent permeation of oxygen or moisture into the emission material layer EML. In addition, the encapsulation layer TFE may include at least one organic film to protect the emission material layer EML from particles such as dust. For example, the encapsulation layer TFE may include a first inorganic film TFE1, an organic film TFE2 and a second inorganic film TFE3.

The first inorganic film TFE1 may be disposed on the second light-emitting electrode 173. The organic film TFE2 may be disposed on the first inorganic film TFE1, and the second inorganic film TFE3 may be disposed on the organic film TFE2. The first inorganic film TFE1 and the second inorganic film TFE3 may include multiple films in which one or more inorganic films of a silicon nitride layer, a silicon oxynitride layer, a silicon oxide layer, a titanium oxide layer and an aluminum oxide layer that are alternately stacked on one another. The organic layer TFE2 may be formed as an organic film such as an acryl resin, an epoxy resin, a phenolic resin, a polyamide resin and a polyimide resin.

Figure 8:
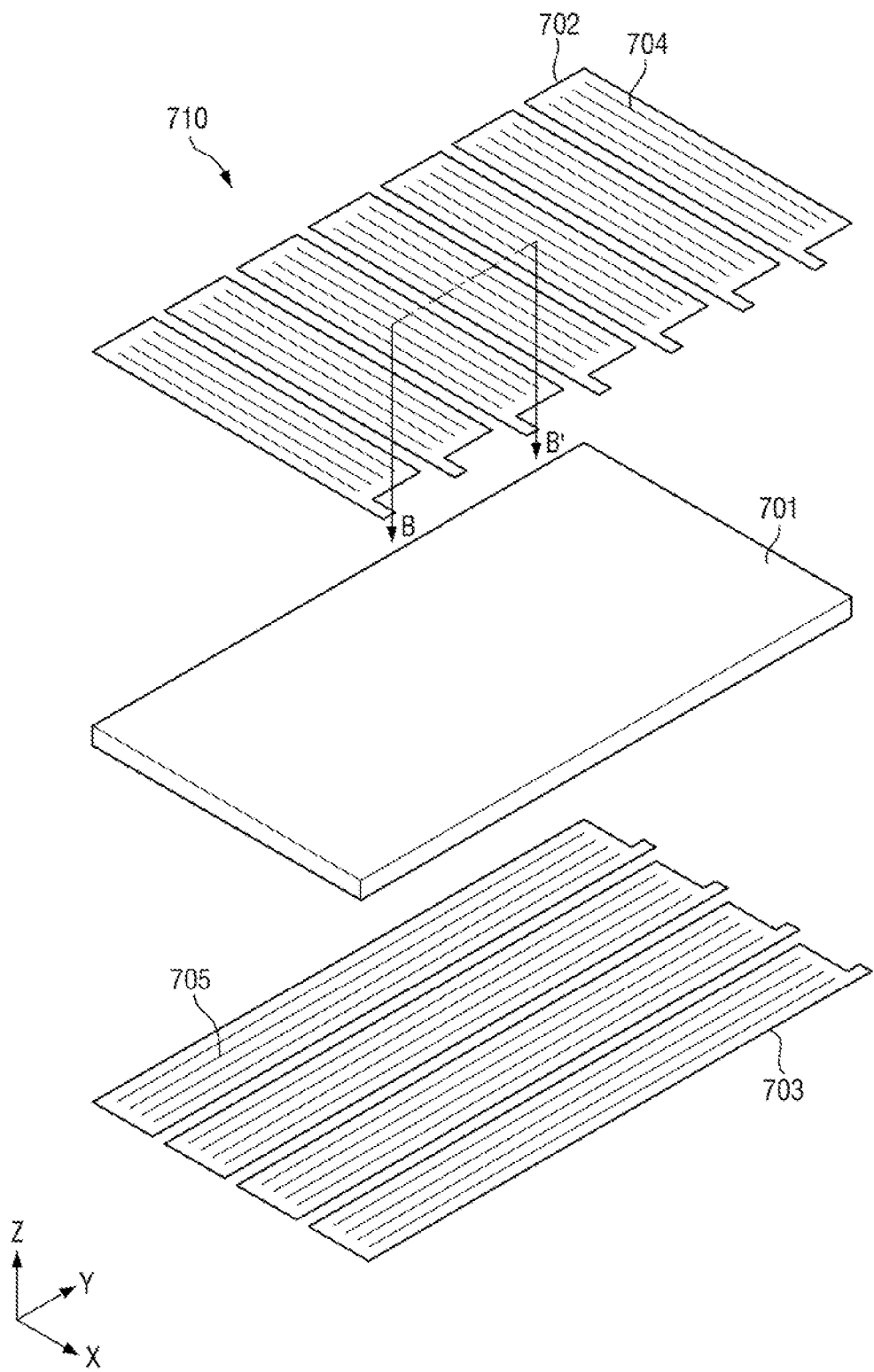
FIG. 8 is an exploded perspective view illustrating a first digitizer layer of FIG. 6.

FIG. 8 is an exploded perspective view illustrating an example of the first digitizer layer of FIG. 6.

Figure 9:
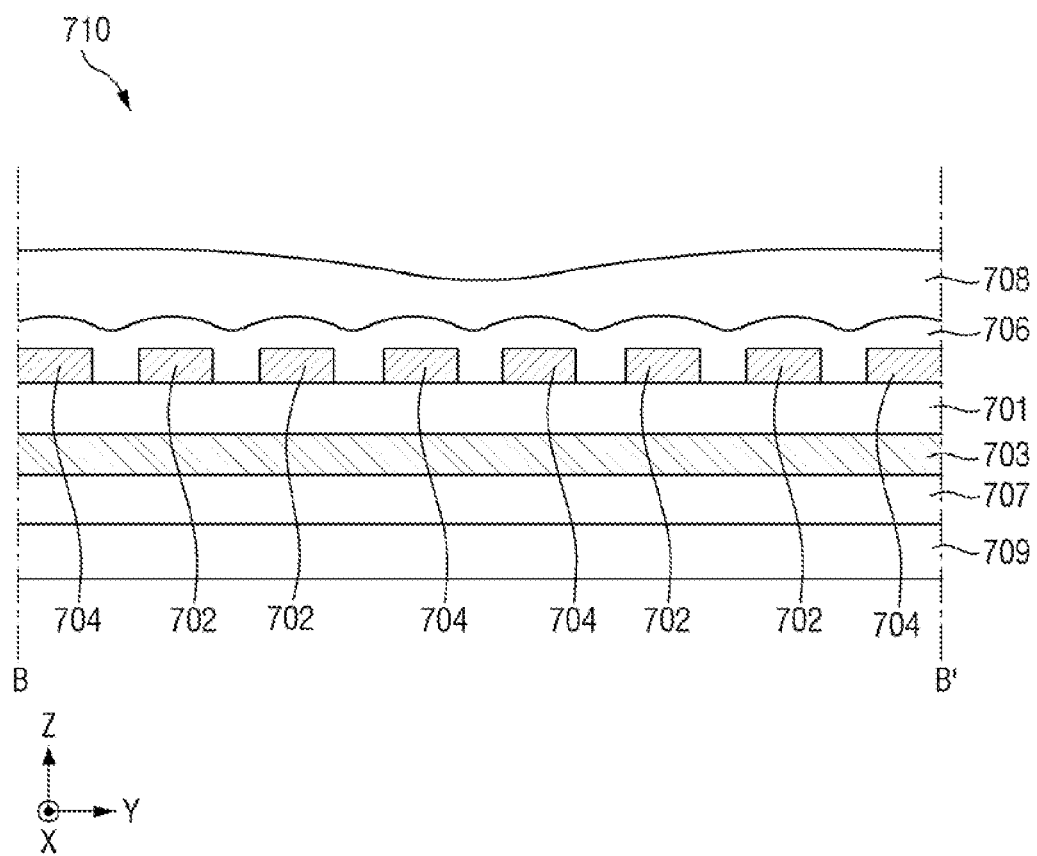
FIG. 9 is a cross-sectional view illustrating the first digitizer layer, taken along line B-B' of FIG. 8.

FIG. 9 is a cross-sectional view illustrating an example of the first digitizer layer, taken along line B-B' of FIG. 8.

Referring to FIGS. 8 and 9, the first digitizer layer 710 according to an embodiment of the present invention includes a base layer 701, first electrode patterns 702, second electrode patterns 703, and first dummy patterns 704, second dummy patterns 705, a first adhesive layer 706, a second adhesive layer 707, a first cover layer 708, and a second cover layer 709.

The base layer 701 may have flexibility and may include an insulating material. For example, the base layer 310 may include polyimide.

The first electrode patterns 702 and the first dummy patterns 704 may be disposed on the front surface of the base layer 701. The second electrode patterns 703 and the second dummy patterns 705 may be disposed on another surface of the base layer 701.

The first electrode patterns 702 may be extended in the first direction (e.g., the x-axis direction). The first electrode patterns 702 may be arranged along the second direction (e.g., the y-axis direction). For example, each of the first electrode patterns 702 may have a loop-like shape when viewed from the top. However, the present invention is not limited thereto. For example, each of the first electrode patterns 702 may have a polygonal shape.

The second electrode patterns 703 may be extended in the second direction (e.g., the y-axis direction). The second electrode patterns 703 may be arranged along the first direction (e.g., the x-axis direction). Each of the second electrode patterns 703 may have a loop-like shape when viewed from the top. However, the present invention is not limited thereto. For example, each of the second electrode patterns 703 may have a polygonal shape.

The first electrode patterns 702 may extend in direction that crosses the direction in which the second electrode patterns 703 extends. Accordingly, the magnetic field or electromagnetic signal emitted from the electronic pen can be absorbed by the first electrode patterns 702 and the second electrode patterns 703, and thus it is possible to determine to which position of the digitizer layer 700 the electronic pen is proximate.

In addition, the first electrode patterns 702 and the second electrode patterns 703 may generate magnetic field upon receiving an input current, and the generated magnetic field or electromagnetic signal may be absorbed by the electronic pen. The electronic pen may emit back the absorbed magnetic field, and the magnetic field emitted by the electronic pen may be absorbed by the first electrode patterns 702 and the second electrode patterns 703. The first electrode patterns 702 and the second electrode patterns 703 may convert the magnetic field or the electromagnetic signal output from the electronic pen into electric signal.

Although each of the first electrode patterns 702 and the second electrode patterns 703 has a rectangular loop structure when viewed from the top in the example shown in FIG. 8, the embodiment of the present invention is not limited thereto. Each of the first electrode patterns 702 and the second electrode patterns 703 may have various types of loop structures such as a diamond loop structure or a hexagonal loop structure when viewed from the top.

When the first electrode pattern 702 has a rectangular loop structure when viewed from the top, the sides of the first electrode pattern 702 facing each other may be distant. Accordingly, the parts of the digitizer layer 700 where the first electrode patterns 702 are disposed may be convex while the parts of the digitizer layer 700 where the first electrode patterns 702 are not disposed may be concave. Therefore, to prevent such concave-convex shape from being formed in the digitizer layer 700, at least one first dummy pattern 704 may be surrounded by the first electrode pattern 702.

The first dummy patterns 704 may be extended in the first direction (e.g., the x-axis direction). The first dummy patterns 704 may be arranged in the second direction (e.g., the y-axis direction). The first dummy patterns 704 surrounded by the first electrode pattern 702 may be equally spaced apart from one another.

In addition, when the second electrode pattern 703 has a rectangular loop structure when viewed from the top, the sides of the second electrode pattern 703 facing each other may be spaced apart. Accordingly, the parts of the digitizer layer 700 where the second electrode patterns 703 are disposed may be convex while the parts of the digitizer layer 700 where the second electrode patterns 703 are not disposed may be concave. Therefore, to prevent such concave-convex shape from being formed in the digitizer layer 700, at least one second dummy pattern 705 may be surrounded by the second electrode pattern 703.

The second dummy patterns 705 may be extended in the second direction (e.g., the y-axis direction). The second dummy patterns 705 may be arranged in the first direction (e.g., the x-axis direction). The second dummy patterns 705 surrounded by the respective second electrode pattern 703 may be substantially equally spaced apart from one another.

In the example shown in FIG. 8, the first dummy patterns 704 are extended in the first direction (e.g., the x-axis direction) and the first dummy patterns 704 are arranged in the second direction (e.g., the y-axis direction), while the second dummy patterns 705 are extended in the second direction (e.g., the y-axis direction) and are arranged in the first direction (e.g., the x-axis direction). It is, however, to be understood that the present invention is not limited thereto. The first dummy patterns 704 may be extended in the second direction (e.g., the y-axis direction) and may be arranged in the first direction (e.g., the x-axis direction), while the second dummy patterns 705 may be extended in the first direction (e.g., the x-axis direction) and may be arranged in the second direction (e.g., the y-axis direction).

Each of the first electrode patterns 702, the first dummy patterns 704, the second electrode patterns 703, and the second dummy patterns 705 may include a metal material such as copper (Cu), silver (Ag), nickel (Ni) and/or tungsten (W).

The first adhesive layer 706 may be disposed over the base layer 701, the first electrode patterns 702, and the first dummy patterns 704. The first cover layer 708 may be disposed on the first adhesive layer 706. The first cover layer 708 may be attached to the base layer 701 by the first adhesive layer 706. The first adhesive layer 706 may be, for example, a pressure sensitive adhesive. The first cover layer 708 may have flexibility and may include an insulating material. For example, the first cover layer 708 may be polyimide.

The second adhesive layer 707 may be disposed on the base layer 701, the second electrode patterns 703, and the second dummy patterns 705. The second cover layer 709 may be disposed on the second adhesive layer 707. The second cover layer 709 may be attached to the base layer 701 by the second adhesive layer 707. The second adhesive layer 707 may be, for example, a pressure sensitive adhesive. The second cover layer 709 may have flexibility and may include an insulating material. For example, the second cover layer 709 may be polyimide.

Figure 10:
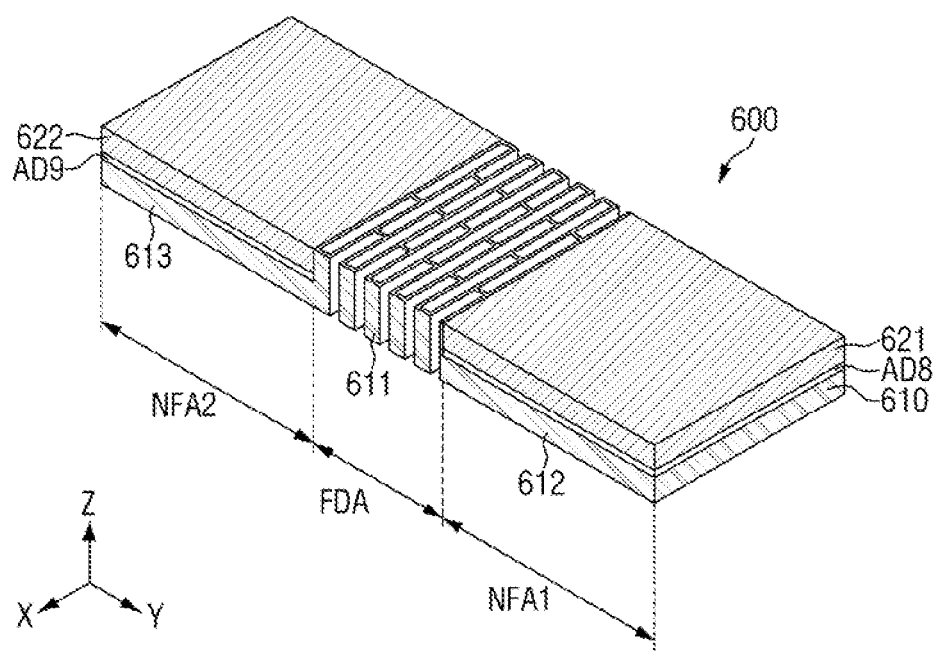
FIG. 10 is a perspective view illustrating the step covering layer of FIG. 6.
Figure 11:
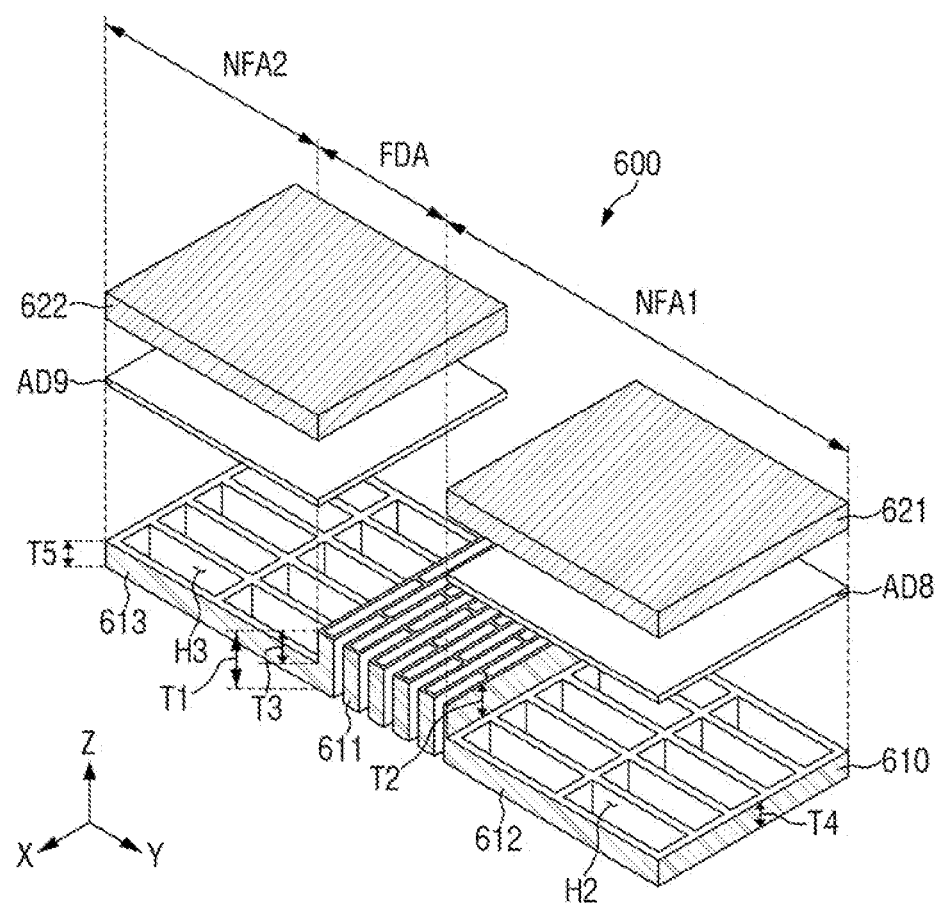
FIG. 11 is an exploded perspective view illustrating the step covering layer of FIG. 6.

FIG. 10 is a perspective view illustrating an example of the step covering layer of FIG. 6. FIG. 11 is an exploded perspective view illustrating an example of the step covering layer of FIG. 6.

Referring to FIGS. 10 and 11, the step covering layer 600 according to an embodiment of the present invention may include a metal plate 610, a first non-metal plate 621, a second non-metal plate 622, an eighth adhesive member AD8, and a ninth adhesive member AD9.

The metal plate 610 includes a first metal plate 611, a second metal plate 612, and a third metal plate 613.

The first metal plate 611 may overlap the folding area FDA and may have a first thickness T1. The first metal plate 611 may overlap the first folding line FL1 and the second folding line FL2. For example, one side surface of the first metal plate 611 may overlap with the first folding line FL1, while the opposite side surface of the first metal plate 611 may overlap with the second folding line FL2. It is, however, to be understood that the present invention is not limited thereto. When the length of the first metal plate 611 in the first direction (e.g., the x-axis direction) is larger than the length of the folding area FDA in the first direction (e.g., the z-axis direction), the front surface of the first metal plate 611 may overlap with the first folding line FL1 and the second folding line FL2.

The first metal plate 611 may include a plurality of slits SLT defined by a plurality of bars BAR (see FIG. 13) and a plurality of first holes H1 to reduce folding stress. The plurality of bars BAR and the plurality of slits SLT will be described later with reference to FIG. 13. The plurality of first holes H1 will be described later with reference to FIG. 14.

The second metal plate 612 may overlap the first non-folding area NFA1 and may protrude from one side of the first metal plate 611. The length Lm2 of the second metal plate 612 in the second direction (e.g., the y-axis direction) may be larger than the length Lm1 of the first metal plate 611 in the second direction (e.g., the y-axis direction), but the present invention is not limited thereto. For example, the length Lm2 of the second metal plate 612 in the second direction (e.g., the y-axis direction) may be equal to the length Lm1 of the first metal plate 611 in the second direction (e.g., the y-axis direction). The length Lm1 of the first metal plate 611 in the second direction (e.g., the y-axis direction) may depend on the length of the folding area FDA in the second direction (e.g., the y-axis direction). The length Lm2 of the second metal plate 612 in the second direction (e.g., the y-axis direction) may depend on the length of the first non-folding area NFA1 in the second direction (e.g., the y-axis direction).

In addition, the rear surface of the second metal plate 612 may be extended from the rear surface of the first metal plate 611. Therefore, the rear surface of the second metal plate 612 and the rear surface of the first metal plate 611 may be connected with each other to form a flat surface.

The third metal plate 613 may overlap the second non-folding area NFA2 and may protrude from another side of the first metal plate 611. The length Lm2 of the third metal plate 613 in the second direction (e.g., the y-axis direction)

may be larger than the length Lm1 of the first metal plate 611 in the second direction (e.g., the y-axis direction), but the present invention is not limited thereto. For example, the length Lm3 of the third metal plate 613 in the second direction (e.g., the y-axis direction) may be equal to the length Lm1 of the first metal plate 611 in the second direction (e.g., the y-axis direction). In addition, the length Lm3 of the third metal plate 613 in the second direction (e.g., the y-axis direction) may be substantially equal to the length Lm2 of the second metal plate 612 in the second direction (e.g., the y-axis direction), but the present invention is not limited thereto. For example, the length Lm3 of the third metal plate 613 in the second direction (e.g., the y-axis direction) may be different from the length Lm2 of the second metal plate 612 in the second direction (e.g., the y-axis direction). The length Lm3 of the third metal plate 613 in the second direction (e.g., the y-axis direction) may depend on the length of the second non-folding area NFA2 in the second direction (e.g., the y-axis direction).

In addition, the rear surface of the third metal plate 613 may be extended from the rear surface of the first metal plate 611. Therefore, the rear surface of the third metal plate 613 and the rear surface of the first metal plate 611 may be connected with each other to form a flat surface.

Since the second metal plate 612 has a fourth thickness T4 smaller than the first thickness T1, a part of one side surface of the first metal plate 611 may be exposed. Since the third metal plate 613 has a fifth thickness T5 smaller than the first thickness T1, a part of the opposite side surface of the first metal plate 611 may be exposed. For example, an upper part of the side and an upper part of the opposite side of the first metal plate 611 may be exposed. Accordingly, the side surface of the metal plate 610 may have an inverted T-shape in which the first metal plate 611 protrudes upward from the second metal plate 612 and the third metal plate 613.

The second metal plate 612 may include a plurality of second holes H2 to reduce attenuation of the magnetic field or the electromagnetic signal emitted from the electronic pen by the second metal plate 612. Likewise, the third metal plate 613 may include a plurality of third holes H3 to reduce attenuation of the magnetic field or the electromagnetic signal emitted from the electronic pen by the third metal plate 613. The plurality of second holes H2 and the third holes H3 will be described later in conjunction with FIGS. 14 and 15.

The first non-metal plate 621 may be attached to the front surface of the second metal plate 612 by the eighth adhesive member AD8, and the second non-metal plate 622 may be attached to the front surface of the third metal plate 613 by the ninth adhesive member AD9. The eighth adhesive member AD8 and the ninth adhesive member AD9 may be pressure sensitive adhesives.

In the first non-folding area NFA1, the sum of the thickness T4 of the second metal plate 612, the thickness of the eighth adhesive member AD8 and the thickness of the first non-metal plate 621 may be substantially equal to the thickness T1 of the first metal plate 611. That is to say, the sum of the thickness of the eighth adhesive member AD8 and the thickness of the first non-metal plate 621 in the first non-folding area NFA1 may be substantially equal to the thickness T2 of the exposed side surface of the first metal plate 611.

In the second non-folding area NFA2, the sum of the thickness T5 of the third metal plate 613, the thickness of the ninth adhesive member AD9 and the thickness of the second non-metal plate may be substantially equal to the thickness T1 of the first metal plate 611. That is to say, the sum of the thickness of the ninth adhesive member AD9 and the thickness of the second non-metal plate 622 in the second non-folding area NFA2 may be substantially equal to the thickness T3 of the exposed opposite side surface of the first metal plate 611.

The maximum thickness of the metal plate 610 may be greater than each of the maximum thickness of the first non-metal plate 621 and/or the maximum thickness of the second metal plate 612. In such case, the maximum thickness of the metal plate 610 may be substantially equal to the thickness T1 of the first metal plate 611.

The step covering layer 600 may have the substantially constant thickness equal to the first thickness T1 across the folding area FDA, the first non-folding area NFA1 and the second non-folding area NFA2. Therefore, the front surface of the step covering layer 600 may be formed flat. Accordingly, when the step covering layer 600 is disposed on the digitizer layer 700 and the shielding member 800, the step covering layer 600 do not have an uneven shape (e.g., an uneven surface) even though the electrode patterns 700 of the digitizer layer 700 have level differences. Therefore, the panel protective film 500 disposed on the step covering layer 600 do not have an uneven shape (e.g., an uneven surface), either. Accordingly, it is possible to prevent the uneven shape of the panel protective film 500 due to the level differences of the lines of the digitizer layer 700, and accordingly, possibly prevent the uneven shape from being recognized by the user on the front of the display device when high luminance light is illuminated to the front of the display device while no image is displayed thereon.

In addition, the thickness T4 of the second metal plate 612 and the thickness T5 of the third metal plate 613 are smaller than the thickness T1 of the first metal plate 611. Therefore, it is possible to reduce the thickness of the metal plate 610 in the first non-folding area NFA1 and the second non-folding area NFA2, thereby reducing the attenuation of the magnetic field or electromagnetic signal emitted from the electronic pen by the metal plate 610.

Figure 12:
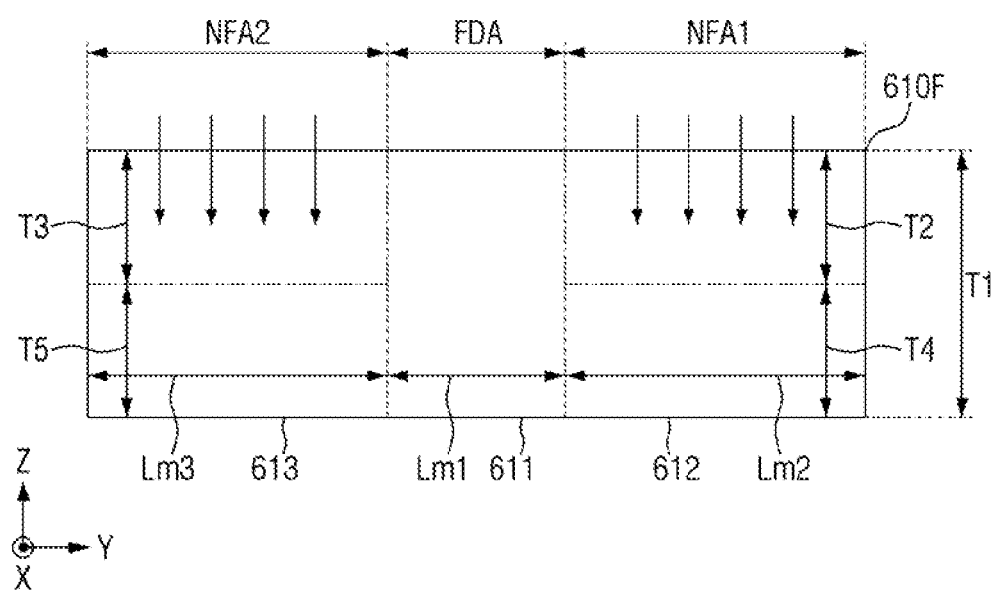
FIG. 12 is a side view of a metal plate for illustrating a method of fabricating the metal plate of FIG. 10.

FIG. 12 is a side view of a metal plate for illustrating a method of fabricating the metal plate of FIG. 10.

Referring to FIG. 12, the metal plate 610 may be produced via a process of etching out a part of the front surface of the metal plate 610F having the first thickness T1 before etching which overlaps the first non-folding area NFA1 by the second thickness T2 and etching out a part of the front surface thereof which overlaps the second non-folding area NFA2 by the third thickness T3. That is to say, the second metal plate 612 having the fourth thickness T4 may be formed by etching out the part of the front surface overlapping the first non-folding area NFA1 by the second thickness T2. The third metal plate 613 having the fifth thickness T5 may be formed by etching out the part of the front surface overlapping the second non-folding area NFA2 by the third thickness T3.

The etching process may be performed by, for example, a wet etching process in which the metal plate 610F is etched through chemical reaction using an etching solution. The etching solution may include at least one of acidic solutions such as nitric acid, sulfuric acid, and hydrochloric acid.

The second thickness T2, which is the thickness by which the metal plate 610 overlapping the first non-folding area NFA1 is etched out, may be about 30% to about 80% of the first thickness T1. If the second thickness T2 is less than about 30% of the first thickness T1, the magnetic field or electromagnetic signal emitted from the electronic pen may be weakened by the second metal plate 612 overlapping the first non-folding area NFA1. As a result, the electronic pen cannot be recognized well. In addition, if the second thickness T2 is equal to or greater than about 80% of the first thickness T1, although the electronic pen can be recognized well but the display panel 100 and the digitizer layer 700 cannot be supported sufficiently. In view of the above, the fourth thickness T4, which is the thickness of the second metal plate 612 formed after the etching, may be about 20% to about 70% of the first thickness T1. In an embodiment of the present invention, the second thickness T2 may be about 40% to about 60% of the first thickness T1. In an embodiment of the present invention, the second thickness T2 may be about 50% to about 60% of the first thickness T1.

The third thickness T3, which is the thickness by which the metal plate 610 overlapping the second non-folding area NFA2 that is etched out, may be about 30% to about 80% of the first thickness T1. If the third thickness T3 is less than about 30% of the first thickness T1, the magnetic field or electromagnetic signal emitted from the electronic pen may be weakened by the third metal plate 613 overlapping the second non-folding area NFA2. As a result, the electronic pen cannot be recognized well. In addition, if the third thickness T3 is equal to or greater than about 80% of the first thickness T1, although the electronic pen can be recognized well but the display panel 100 and the digitizer layer 700 cannot be supported sufficiently. In view of the above, the fifth thickness T5, which is the thickness of the third metal plate 613 formed after the etching, may be about 20% to about 70% of the first thickness T1. In an embodiment of the present invention, the third thickness T3 may be about 40% to about 60% of the first thickness T1. In an embodiment of the present invention, the third thickness T3 may be about 50% to about 60% of the first thickness T1.

The second thickness T2, by which the part of the metal plate 610 overlapping the first non-folding area NFA1 is etched out, may be substantially equal to the third thickness T3, by which the part of the metal plate 610 overlapping the second non-folding area NFA2 is etched out. In this instance, the fourth thickness T4 that is the thickness of the second metal plate 612 may be substantially equal to the fifth thickness T5 that is the thickness of the third metal plate 613.

Although the second thickness T2 is substantially equal to the third thickness T3 in the example shown in FIG. 11, it should be noted that the present invention is not limited thereto. The second thickness T2 may be different from the third thickness T3.

Figure 13:
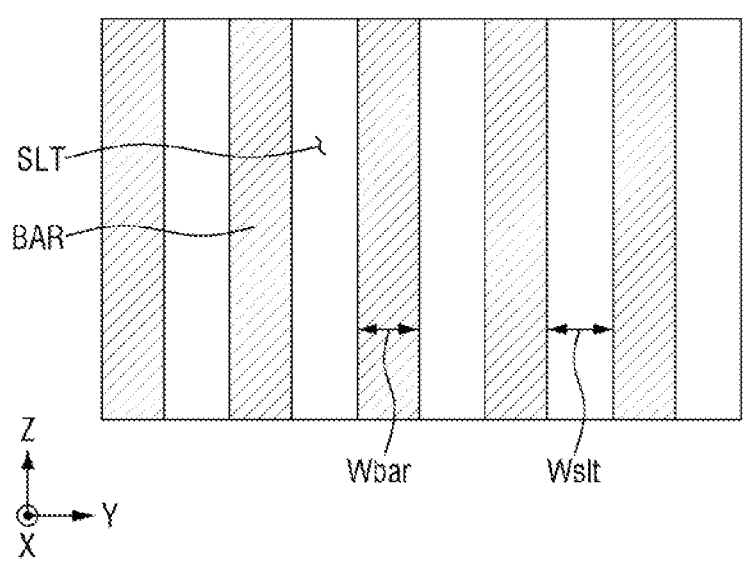
FIG. 13 is a view showing a side surface of the metal plate overlapping the folding area of FIG. 10.
Figure 14:
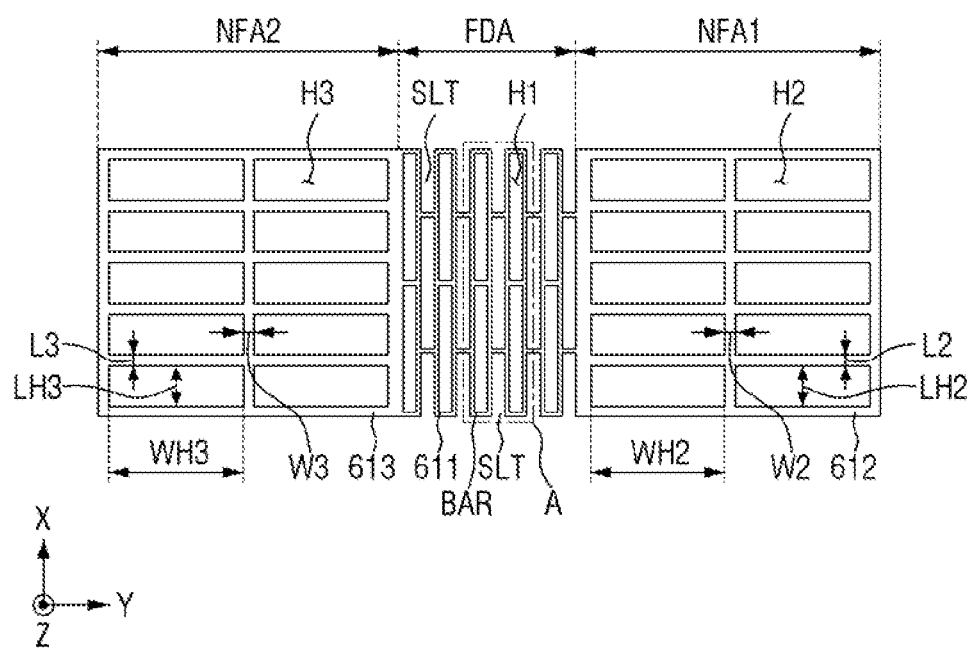
FIG. 14 is a plan view of the metal plate of FIG. 11.
Figure 15:
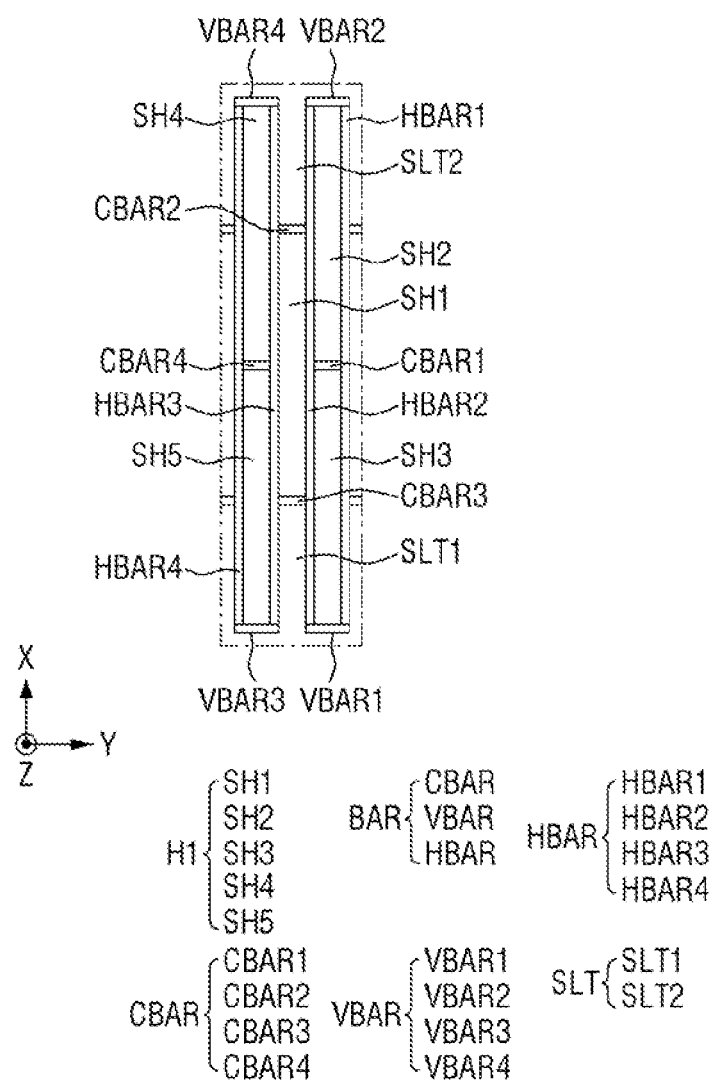
FIG. 15 is an enlarged view of area A of FIG. 14.

FIG. 13 is a view illustrating a side surface of the metal plate overlapping the folding area of FIG. 10. FIG. 14 is a plan view of the metal plate of FIG. 11. FIG. 15 is an enlarged view of area A of FIG. 14.

Referring to FIGS. 13 to 15, the first metal plate 611 may include a plurality of first holes H1, and a plurality of slits SLT formed by the plurality of bars BAR. The plurality of first holes H1 may be formed in the folding area FDA so that the metal plate 610 is bent easily in the folding area FDA.

The second metal plate 612 may include a plurality of second holes H2 to reduce attenuation of the magnetic field or the electromagnetic signal emitted from the electronic pen by the metal plate 610. The third metal plate 613 may include a plurality of third holes H3 to reduce attenuation of the magnetic field or the electromagnetic signal emitted from the electronic pen by the metal plate 610.

As shown in FIG. 13, the plurality of bars BAR disposed on the first metal plate 611 may be extended in the third direction (e.g., the z-axis direction). The plurality of bars BAR may be arranged in the second direction (e.g., the y-axis direction).

The slits SLT may be located between adjacent bars of the plurality of bars BAR. If the width Wbar of each of the plurality of bars BAR is larger than the width Wslt of each of the slits SLT, the metal plate 610 might not be easily bent when the display device 10 is folded. Therefore, the width Wbar of each of the plurality of bars BAR may be smaller than or substantially equal to the width Wslt of each of the plurality of slits SLT as shown in FIG. 13.

As shown in FIGS. 14 and 15, the plurality of first holes H1 may include first sub-holes SH1, second sub-holes SH2, third sub-holes SH3, fourth sub-holes SH4 and fifth sub-holes SH5.

The first sub-holes SH1 may be located between the slits SLT overlapping in the first direction (e.g., the x-axis direction).

The second sub-holes SH2 and the third sub-holes SH3 may be located between the bars BAR adjacent to the slits SLT in the second direction (y-axis direction).

The fourth sub-holes SH4 and the fifth sub-holes SH5 may be located between adjacent bars adjacent to the slits SLT in the opposite direction to the second direction (e.g., the y-axis direction).

The plurality of bars BAR may include a plurality of horizontal bars HBAR, a plurality of vertical bars VBAR, and a plurality of connection bars CBAR.

The plurality of horizontal bars HBAR may include a first horizontal bar HBAR1, a second horizontal bar HBAR2, a third horizontal bar HBAR3, and a fourth horizontal bar HBAR4. The first horizontal bar HBAR1, the second horizontal bar HBAR2, the third horizontal bar HBAR3 and the fourth horizontal bar HBAR4 may be extended in the first direction (e.g., the x-axis direction) and may be arranged in the second direction (e.g., the y-axis direction). For example, as shown in FIG. 15, the second horizontal bar HBAR2 may be disposed on one side of the first horizontal bar HBAR1, and the third horizontal bar HBAR3 may be disposed on one side of the second horizontal bar HBAR2. The fourth horizontal bar HBAR4 may be disposed on one side of the third horizontal bar HBAR3.

The plurality of vertical bars VBAR may include a first vertical bar VBAR1, a second vertical bar HBAR2, a third vertical bar VBAR3, and a fourth vertical bar VBAR4. The first vertical bar VBAR1, the second vertical bar VBAR2, the third vertical bar VBAR3 and the fourth vertical bar VBAR4 may be extended in the second direction (e.g., the y-axis direction).

The first vertical bar VBAR1 may be disposed between one end of the first horizontal bar HBAR1 and one end of the second horizontal bar HBAR2. The end of the first horizontal bar HBAR1 and the end of the second horizontal bar HBAR2 may be connected to each other by the first vertical bar VBAR1.

The second vertical bar VBAR2 may be disposed between the other end of the first horizontal bar HBAR1 and the other end of the second horizontal bar HBAR2. The other end of the first horizontal bar HBAR1 and the other end of the second horizontal bar HBAR2 may be connected to each other by the second vertical bar VBAR2.

The third vertical bar VBAR3 may be disposed between one end of the third horizontal bar HBAR3 and one end of the fourth horizontal bar HBAR4. The end of the third horizontal bar HBAR3 and the end of the fourth horizontal bar HBAR4 may be connected to each other by the third vertical bar VBAR3.

The fourth vertical bar VBAR4 may be disposed between the other end of the third horizontal bar HBAR3 and the other end of the fourth horizontal bar HBAR4. The other end of the third horizontal bar HBAR3 and the other end of the fourth horizontal bar HBAR4 may be connected to each other by the fourth vertical bar VBAR4.

The plurality of connection bars CBAR may include a first connection bar CBAR1, a second connection bar CBAR2, a third connection bar CBAR3, and a fourth connection bar CBAR4. The first connection bar CBAR1, the second connection bar CBAR2, the third connection bar CBAR3 and the fourth connection bar CBAR4 may be extended in the second direction (e.g., the y-axis direction).

The first connection bar CBAR1 may be disposed between the first horizontal bar HBAR1 and the second horizontal bar HBAR2. The first horizontal bar HBAR1 and the second horizontal bar HBAR2 may be connected to each other by the first connection bar CBAR1. The first connection bar CBAR1 may be disposed between the first vertical bar VBAR1 and the second vertical bar VBAR2 in the first direction (e.g., the x-axis direction).

Each of the second connection bar CBAR2 and the third connection bar CBAR3 may be disposed between the second horizontal bar HBAR2 and the third horizontal bar HBAR3. The second horizontal bar HBAR2 and the third horizontal bar HBAR3 may be connected to each other by the second connection bar CBAR2. The second horizontal bar HBAR2 and the third horizontal bar HBAR3 may be connected to each other by the third connection bar CBAR3. The second connection bar CBAR2 and the third connection bar CBAR3 may overlap each other in the first direction (e.g., the x-axis direction).

The fourth connection bar CBAR4 may be disposed between the third horizontal bar HBAR3 and the fourth horizontal bar HBAR4. The third horizontal bar HBAR3 and the fourth horizontal bar HBAR4 may be connected to each other by the fourth connection bar CBAR4. The fourth connection bar CBAR4 may be disposed between the third vertical bar VBAR3 and the fourth vertical bar VBAR4 in the first direction (e.g., the x-axis direction).

The first sub-hole SH1 may be formed by the second connection bar CBAR2, the third connection bar CBAR3, the second horizontal bar HBAR2 and the third horizontal bar HBAR3. The second sub-hole SH2 may be defined by the first horizontal bar HBAR1, the second horizontal bar HBAR2, the second vertical bar VBAR2 and the first connection bar CBAR1. The third sub-hole SH3 may be formed by the first horizontal bar HBAR1, the second horizontal bar HBAR2, the first vertical bar VBAR1 and the first connection bar CBAR1. The fourth sub-hole SH4 may be formed by the third horizontal bar HBAR3, the fourth horizontal bar HBAR4, the fourth vertical bar VBAR4 and the fourth connection bar CBAR4. The fifth sub-hole SH5 may be formed by the third horizontal bar HBAR3, the fourth horizontal bar HBAR4, the third vertical bar VBAR3 and the fourth connection bar CBAR4.

The second sub-hole SH2 and the third sub-hole SH3 may overlap each other in the first direction (e.g., the x-axis direction). The fourth sub-hole SH4 and the fifth sub-hole SH5 may overlap each other in the first direction (e.g., the x-axis direction). The first sub-hole SH1 may overlap the second sub-hole SH2, the third sub-hole SH3, the fourth sub-hole SH4 and the fifth sub-hole SH5 in the second direction (e.g., the y-axis direction).

The first slit SLT1 may be formed by the second horizontal bar HBAR2, the third horizontal bar HBAR and the third connection bar CBAR3 in the second direction (e.g., the y-axis direction). The second slit SLT2 may be formed by the second horizontal bar HBAR2, the third horizontal bar HBAR3 and the second connection bar CBAR2 in the second direction (e.g., the y-axis direction).

The first slit SLT1 may overlap the first sub-hole SH1 and the second slit SLT2 in the first direction (e.g., the x-axis direction), and may overlap the third sub-hole SH3 and the fifth sub-hole SH5 in the second direction (e.g., the y-axis direction).

The second slit SLT2 may overlap the first sub-hole SH1 and the first slit SLT1 in the first direction (e.g., the x-axis direction), and may overlap the second sub-hole SH2 and the fourth sub-hole SH4 in the second direction (e.g., the y-axis direction).

The second sub-hole SH2, the first sub-hole SH1 and the fourth sub-hole SH4 may be staggered in the second direction (e.g., the y-axis direction). For example, a part of the first sub-hole SH1 may be disposed between a part of the second sub-hole SH2 and a part of the fourth sub-hole SH4 in the second direction (e.g., the y-axis direction). The second slit SL2 may be located between another part of the second sub-hole SH2 and another part of the fourth sub-hole SH4.

The third sub-hole SH3, the first sub-hole SH1 and the fifth sub-hole SH5 may be staggered in the second direction (e.g., the y-axis direction). For example, a part of the first sub-hole SH1 may be disposed between a part of the third sub-hole SH3 and a part of the fifth sub-hole SH5 in the second direction (e.g., the y-axis direction). The first slit SLT1 may be located between another part of the third sub-hole SH3 and another part of the fifth sub-hole SH5.

Since the first metal plate 611 is not etched during the process of fabricating the metal plate 610, the thickness T1 of the first metal plate 611 may be larger than each of the thickness T4 of the second metal plate 612 and the thickness T5 of the third metal plate 613. However, the plurality of first holes H1 formed in the first metal plate 611 are extended in the direction substantially parallel to the first folding line FL1 and the second folding line FL2, and thus the first metal plate 611 can be easily bent when it is folded along the first folding line FL1 and the second folding line FL2. In addition, the second sub-hole SH2, the first sub-hole SH1 and the fourth sub-hole SH4 are staggered in the second direction (e.g., the y-axis direction), and the third sub-hole SH3, the first sub-hole SH1 and the fifth sub-hole SH5 are staggered in the second direction (e.g., the y-axis direction), the flexibility of the first metal plate 611 can be increased, so that the first metal plate 611 can be easily folded.

As shown in FIG. 14, the second metal plate 612 may include second holes H2, and the third metal plate 613 may include third holes H3.

The plurality of second holes H2 may be extended in the second direction (e.g., the y-axis direction). For example, each of the second holes H2 may have a rectangular shape having the length WH2 in the second direction (e.g., the y-axis direction) larger than the length LH2 in the first direction (e.g., the x-axis direction). Therefore, even when the display device 10 is folded, the second metal plate 612 may not be easily stretched due to the plurality of second holes H2.

In an embodiment of the present invention, each of the second holes H2 may have polygonal shape or a circular shape.

In addition, the distance W2 between the second holes H2 adjacent to each other in the second direction (e.g., the y-axis direction) may be smaller than the length WH2 of each of the second holes H2 in the second direction (e.g., the y-axis direction) to reduce attenuation of the magnetic field or electromagnetic signal emitted from the electronic pen in the first non-folding area NFA1 by the second metal plate 612. In addition, the distance L2 between the second holes H2 adjacent to each other in the first direction (e.g., the x-axis direction) may be smaller than the length LH2 of each of the second holes H2 in the first direction (e.g., the x-axis direction). In addition, the thickness of the second holes H2 may be equal to the fourth thickness T4 that is the thickness of the second metal plate 612.

The plurality of third holes H3 formed in the third metal plate 613 may be extended in the second direction (e.g., the y-axis direction). Each of the third holes H3 may have a rectangular shape having the length WH3 in the second direction (e.g., the y-axis direction) larger than the length LH2 in the first direction (e.g., the x-axis direction). Therefore, even when the display device 10 is folded, the second metal plate 612 may not be easily stretched due to the plurality of second holes H2.

Each of the plurality of third holes H3 may have a rectangular shape with the length WH3 in the second direction (e.g., the y-axis direction) larger than the length LH3 in the first direction (e.g., the x-axis direction) so that it is not easily stretched even when the display device 10 is folded to support the display panel.

In an embodiment of the present invention, each of the plurality of third holes H3 may have a polygonal shape or a circular shape.

In addition, to reduce attenuation of the magnetic field or electromagnetic signal emitted from the electronic pen in the second non-folding area NFA2, the distance W3 between the third holes H3 adjacent to each other in the second direction (e.g., the y-axis direction) may be smaller than the length WH3 of each of the third holes H3 in the second direction (e.g., the y-axis direction). In addition, the distance L3 between the third holes H3 adjacent to each other in the first direction (e.g., the x-axis direction) may be smaller than the length LH3 of each of the third holes H3 in the first direction (e.g., the x-axis direction). In addition, the thickness of the third holes H3 may be equal to the fifth thickness T5 that is the thickness of the third metal plate 613.

The direction in which the second holes H2 are extended may be substantially perpendicular to the direction in which the first holes H1 are extended. The direction in which the third holes H3 are extended may be substantially perpendicular to the direction in which the first holes H1 are extended. Accordingly, when the metal plate 610 is folded, the first metal plate 611 including the first holes H1 has a low bending resistance and thus it is easily folded, whereas the second metal plate 612 including the second holes H2 and the third metal plate 613 including the third holes H3 have a relatively high bending resistance compared to the first metal plate 611 and thus may not be stretched well even when the metal plate 610 is folded. Although FIG. 14 illustrates that the plurality of second holes H2 formed in the second metal plate 612 and the plurality of third holes H3 formed in the third metal plate 613 are formed with a rectangular shape, it is to be noted that the present invention is not limited thereto. The plurality of second holes H2 and the plurality of third holes H3 may be formed in a variety of shapes including polygons, such as a triangle and a hexagon, and circular shapes such as a circle and an ellipse as long as they can avoid weakening of the magnetic field or electromagnetic signal emitted from the electronic pen.

Figure 16:
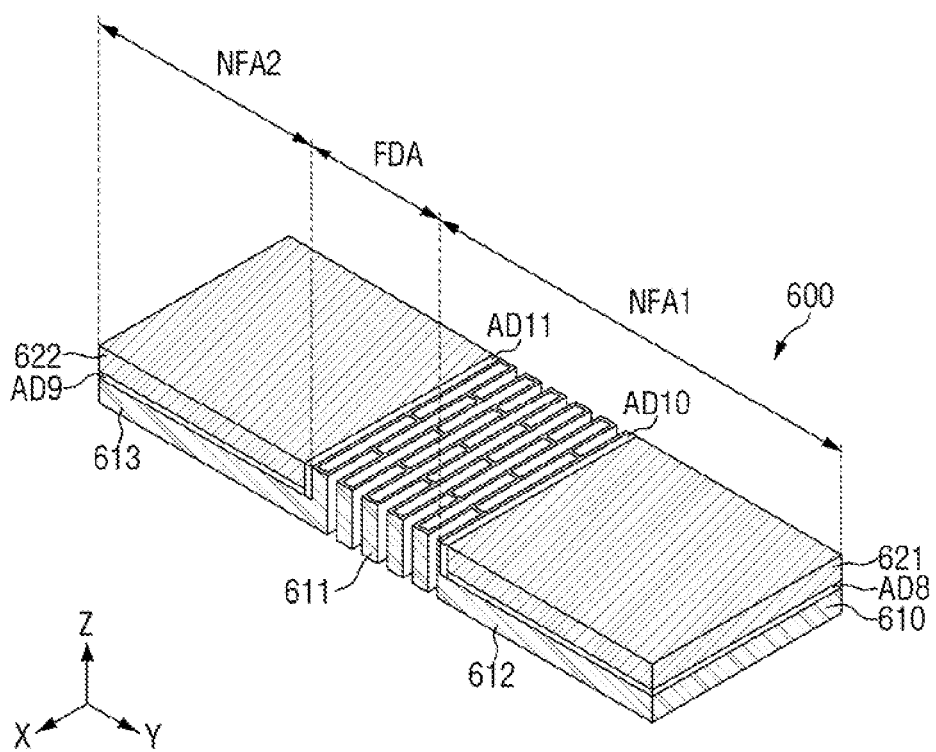
FIG. 16 is a perspective view illustrating the step covering layer of FIG. 6.
Figure 17:
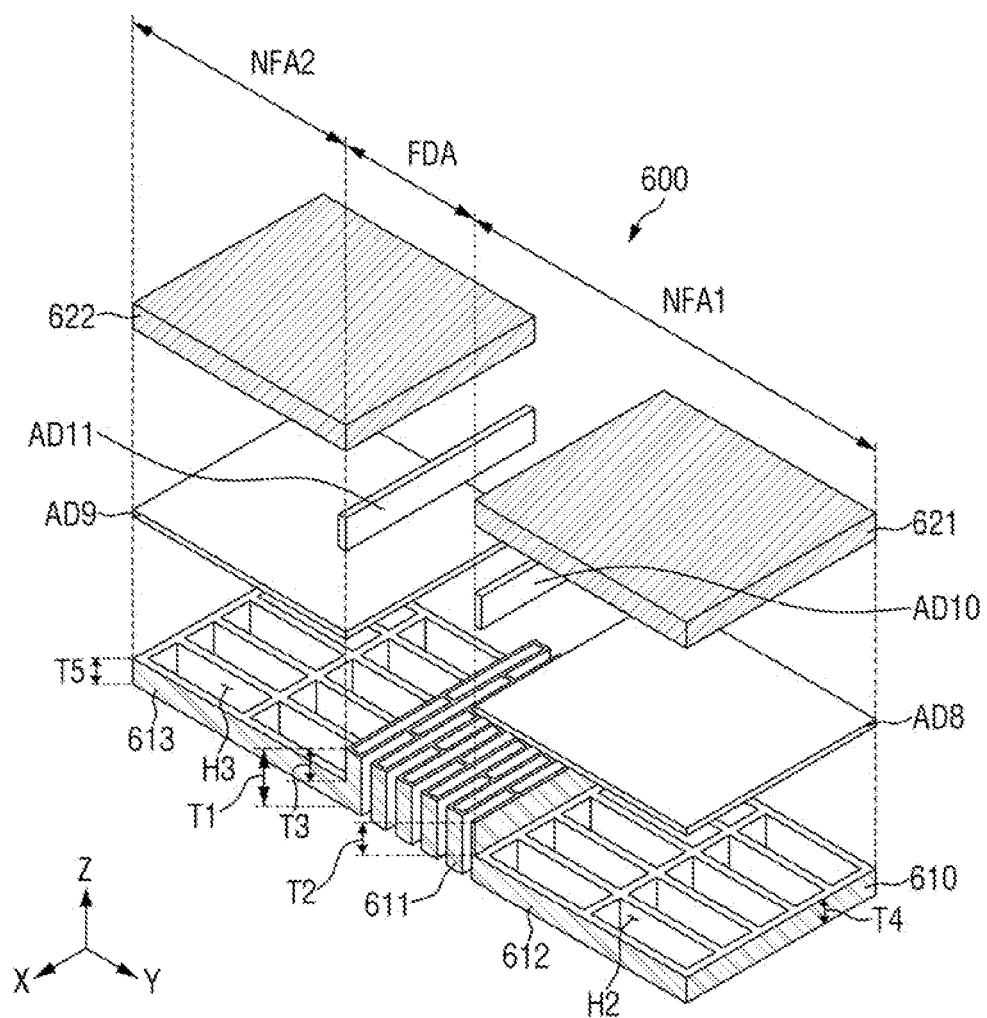
FIG. 17 is an exploded perspective view illustrating the step covering layer of FIG. 6.

FIG. 16 is a perspective view illustrating an example of the step covering layer of FIG. 6. FIG. 17 is an exploded, perspective view illustrating an example of the step covering layer of FIG. 6.

The embodiment of FIG. 16 is different from the embodiment of FIGS. 10 and 12 in that a step covering layer 600 further includes a tenth adhesive member AD10 and an eleventh adhesive member AD11. The following description will focus on the differences.

Referring to FIG. 17, the step covering layer 600 may further include the tenth adhesive member AD10 and the eleventh adhesive member AD11.

To attach the first non-metal plate 621 to the metal plate 610 overlapping with the first non-folding area NFA1, the step covering layer 600 may include the eighth adhesive member AD8 and the tenth adhesive member AD10. The eighth adhesive member AD8 may attach the first non-metal plate 621 to the front surface of the second metal plate 612, and the tenth adhesive member AD10 may attach the first non-metal plate 621 to the side surface of the first metal plate 611 that does not overlap the second metal plate 612 in the second direction (e.g., the y-axis direction) and has the second thickness T2.

To attach the second non-metal plate 622 to the metal plate 610 overlapping with the second non-folding area NFA2, the step covering layer 600 may include the ninth adhesive member AD9 and an eleventh adhesive member AD11. The ninth adhesive member AD9 may attach the second non-metal plate 622 to the front surface of the third metal plate 613, and the eleventh adhesive member AD11 may attach the second non-metal plate 622 to the side surface of the first metal plate 611 that does not overlap with the third metal plate 613 in the second direction (e.g., the y-axis direction) and has the third thickness T3.

In the embodiment of FIGS. 16 and 17, the eighth adhesive member AD8 and the tenth adhesive member AD10 may be separated elements, and the ninth adhesive member AD9 and the eleventh adhesive member AD11 may be separated elements. It is, however, to be understood that the present invention is not limited thereto. For example, in an embodiment of the present invention, the eighth adhesive member AD8 and the tenth adhesive member AD10 may be integrally formed as a single piece, and the ninth adhesive member AD9 and the eleventh adhesive member AD11 may be integrally formed as a single piece.

As described above, as the step covering layer 600 includes the tenth adhesive member AD10 for attaching the first non-metal plate 621 to the metal plate 610 overlapping the first non-folding area NFA1, and further includes the eleventh adhesive member AD11 for attaching the second non-metal plate 622 to the metal plate 610 overlapping the second non-folding area NFA2, the first non-metal plate 621 can be stably disposed on the second metal plate 612, and the second non-metal plate 622 can be stably disposed on the third metal plate 613. Accordingly, the step covering layer 600 can support the display panel 100 and the digitizer layer 700 more stably.

Figure 18:
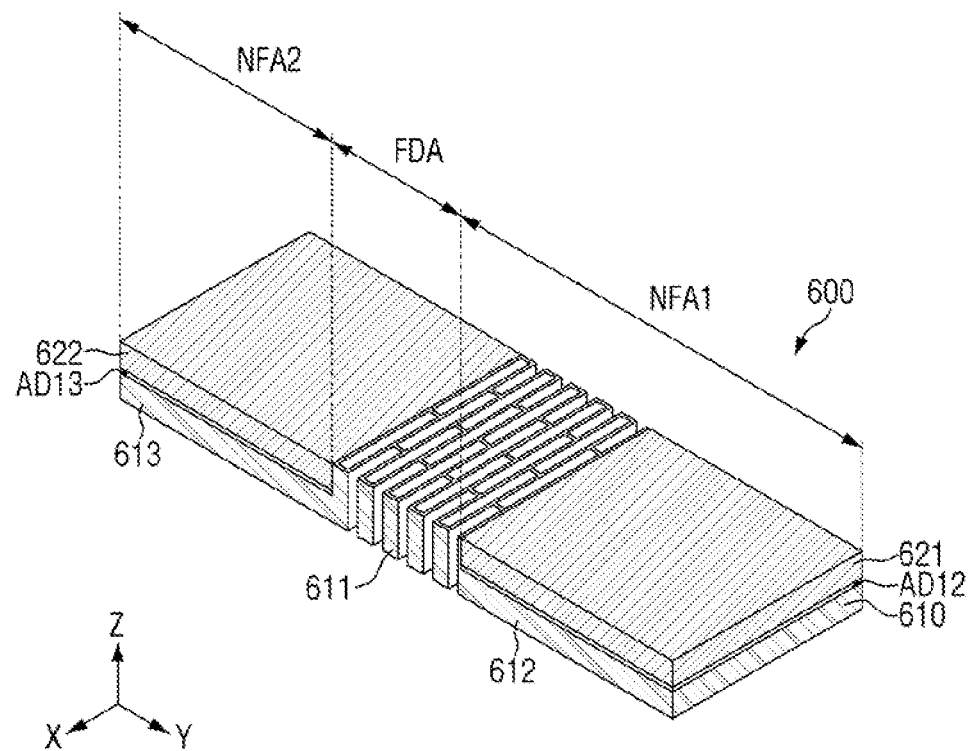
FIG. 18 is a perspective view illustrating the step covering layer of FIG. 6.
Figure 19:
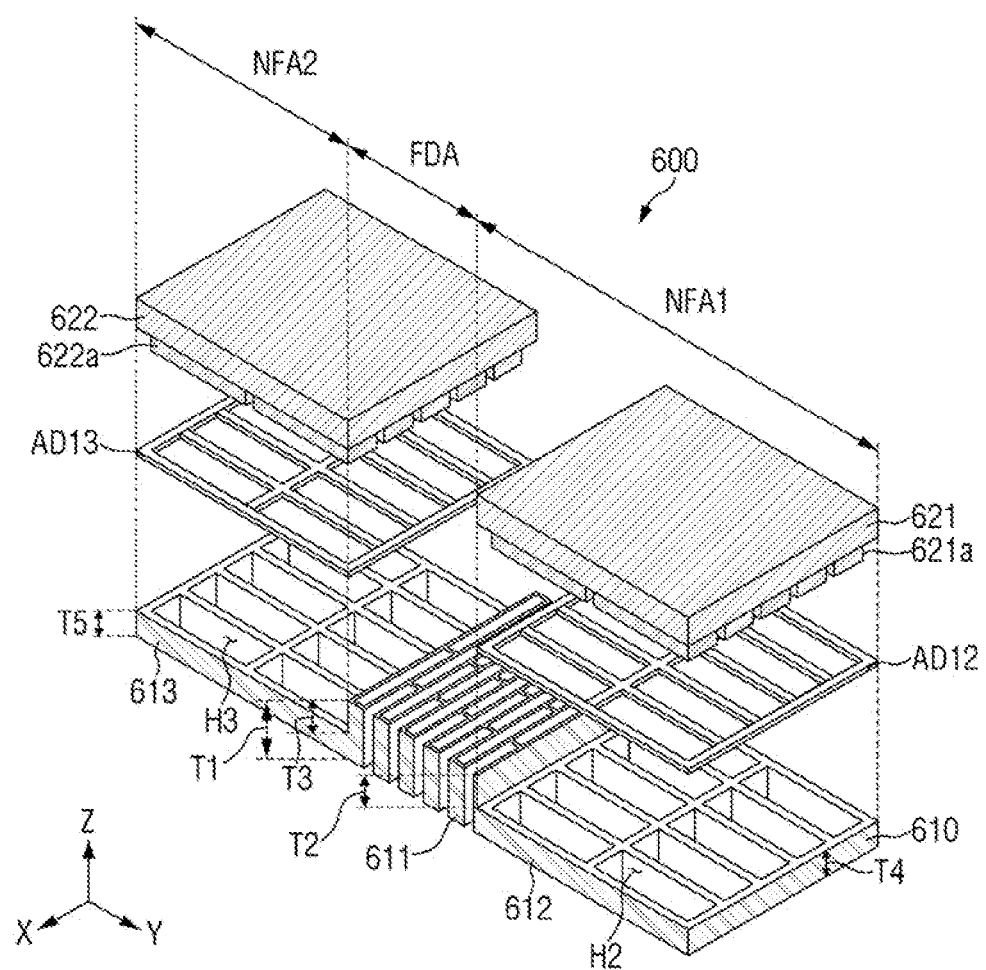
FIG. 19 is an exploded perspective view illustrating the step covering layer of FIG. 6.
Figure 20:
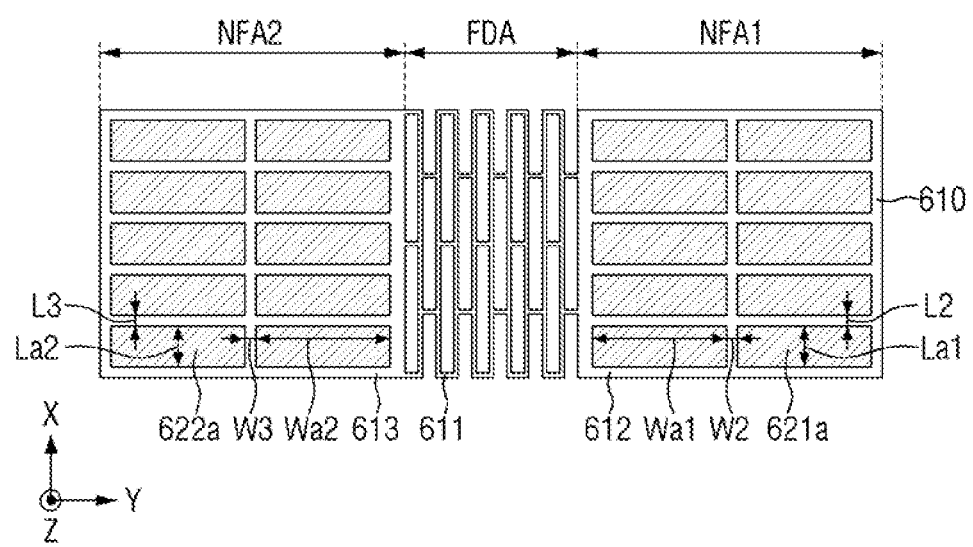
FIG. 20 is a plan view illustrating contact surfaces between metal plates and non-metal plates of the step covering layer of FIG. 18.

FIG. 18 is a perspective view illustrating an example of the step covering layer of FIG. 6. FIG. 19 is an exploded perspective view illustrating an example of the step covering layer of FIG. 6. FIG. 20 is a plan view illustrating contact surfaces between metal plates and non-metal plates of the step covering layer of FIG. 18.

The step covering layer 600 according to the embodiment of FIGS. 18 to 20 is different from the embodiment of FIGS. 10 and 11 in that it includes a twelfth adhesive member AD12 and a thirteenth adhesive member AD13. In addition, a first non-metal plate 621 includes first protrusions 621a, and a second non-metal plate 622 includes second protrusions 622a. The following description will focus on the differences between the embodiment of FIGS. 18 to 20 and the embodiment of FIGS. 10 and 11.

The twelfth adhesive member AD12 may be disposed between the first non-metal plate 621 and the second metal plate 612 and may have holes corresponding to the second holes H2 formed in the second metal plate 612, respectively.

The thirteenth adhesive member AD13 may be disposed between the second non-metal plate 622 and the third metal plate 613 and may have holes corresponding to the third holes H3 formed in the third metal plate 612, respectively.

Referring to FIGS. 18 and 19, the first non-metal plate 621 may include the first protrusions 621a, and the second non-metal plate 622 may include the second protrusions 622a. In this instance, the first non-metal plate 621 may be formed by insert injection molding using a frame including the holes corresponding to the second holes H2 formed in the second metal plate 612. Accordingly, the second holes H2 formed in the second metal plate 612 may be filled with the first protrusions 621a, respectively. For example, the second holes H2 may be at least partially filled by the first protrusions 621a. The second non-metal plate 622 may be formed by insert injection molding using a frame including the holes corresponding to the third holes H3 formed in the third metal plate 613. Accordingly, the third holes H3 formed in the third metal plate 613 may be filled with the second protrusions 622a, respectively. For example, the third holes H3 may be at least partially filled by the second protrusions 622a.

When using the insert injection molding, the first non-metal plate 621 and the second non-metal plate 622 may include, for example, ABS resin (acrylonitrile butadiene styrene copolymer), polycarbonate, polyamide, polyetherimide, epoxy resin, etc.

The first protrusions 621a may be disposed on the rear surface of the first non-metal plate 621 and may be in contact with the front surface of the second metal plate 612. For example, the first protrusions 621a may be formed integrally with the first non-metal plate 621. However, the present invention is not limited thereto.

The second protrusions 622a may be disposed on the rear surface of the second non-metal plate 622 and may be in contact with the front surface of the third metal plate 613. For example, the second protrusions 622a may be formed integrally with the second non-metal plate 622. However, the present invention is not limited thereto.

Referring to FIG. 20, the length Wa1 in the second direction (e.g., the y-axis direction) and the length La1 in the first direction (e.g., the x-axis direction) of each of the first protrusions 621a may be substantially equal to or less than the length WH2 in the second direction (e.g., the y-axis direction) and the length LH2 in the first direction (e.g., the x-axis direction) of each of the second holes H2 formed in the second metal plate 612, respectively. The thickness of each of the first protrusions 621a may be substantially equal to or less than the fourth thickness T4, which is the thickness of each of the second holes H2.

The length Wa1 in the second direction (e.g., the y-axis direction) and the length La2 in the first direction (e.g., the x-axis direction) of each of the second protrusions 622a may be substantially equal to or less than the length WH3 in the second direction (e.g., the y-axis direction) and the length LH3 in the first direction (e.g., the x-axis direction) of each of the third holes H3 formed in the third metal plate 613, respectively. The thickness of each of the second protrusions 622a may be substantially equal to or less than the fifth thickness T5, which is the thickness of each of the third holes H3.

Accordingly, as the first protrusions 621a are inserted into the second holes H2 of the second metal plate 612, respectively, and the second protrusions 622a are inserted into the third holes H3 of the third metal plate 613, respectively, when the step covering layer 600 is folded, the step covering layer 600 overlapping the first non-folding area NFA1 and the second non-folding area NFA2 may not be easily stretched.

Although each of the first protrusions 621a and the second protrusions 622a is formed in a rectangular shape so that it conforms to the shape of each of the second holes H2 and the third holes H3 in the example shown in FIGS. 18 and 19, it should be noted that the present invention is not limited thereto.

As described above, as the second holes H2 and the third holes H3 may be formed in various shapes including polygons, such as a triangle and a hexagon, and circular shapes, such as a circle and an ellipse, the first protrusions 621a and the second protrusions 622a may also have various shapes including polygons, such as a triangle and a hexagon, and circular shapes, such as a circle and an ellipse conforming to the shapes of the second holes H2 and the third holes H3.

Figure 21:
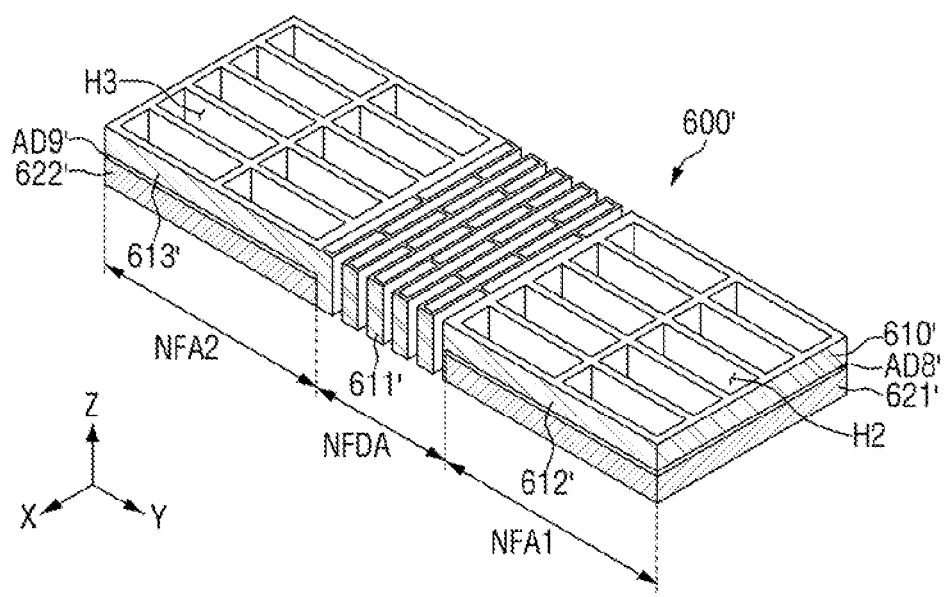
FIG. 21 is a perspective view illustrating the step covering layer of FIG. 6.
Figure 22:
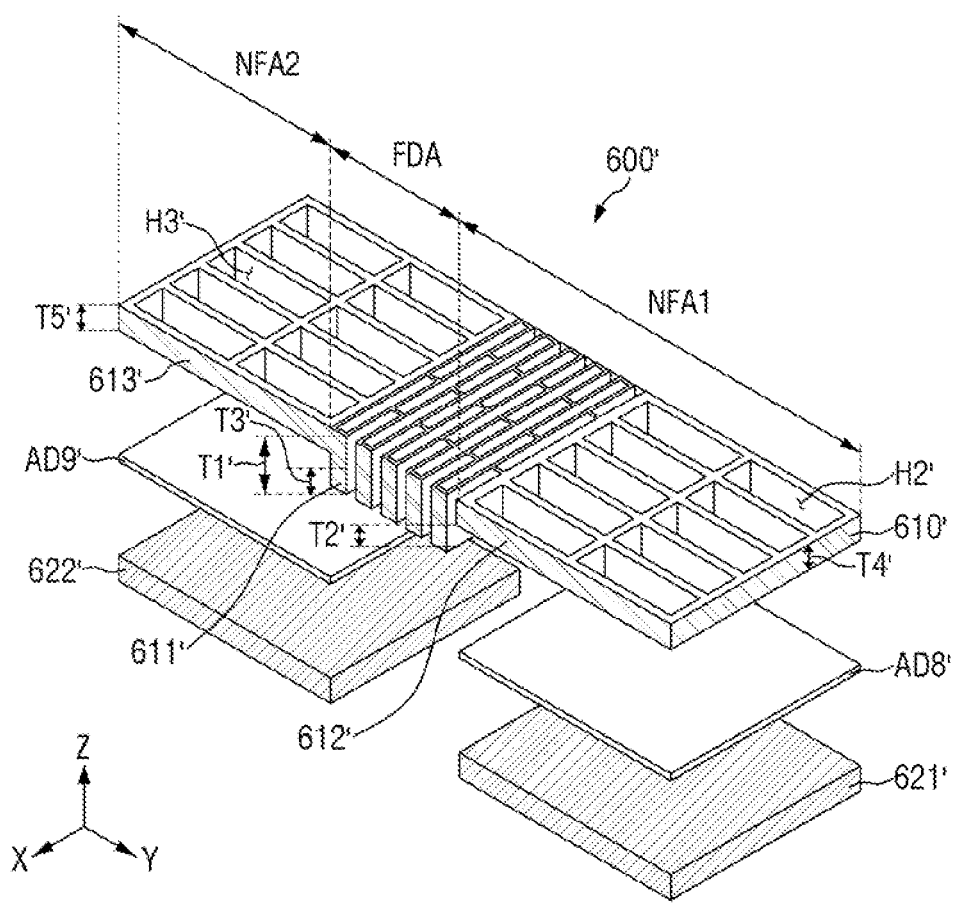
FIG. 22 is an exploded perspective view illustrating the step covering layer of FIG. 6.
Figure 23:
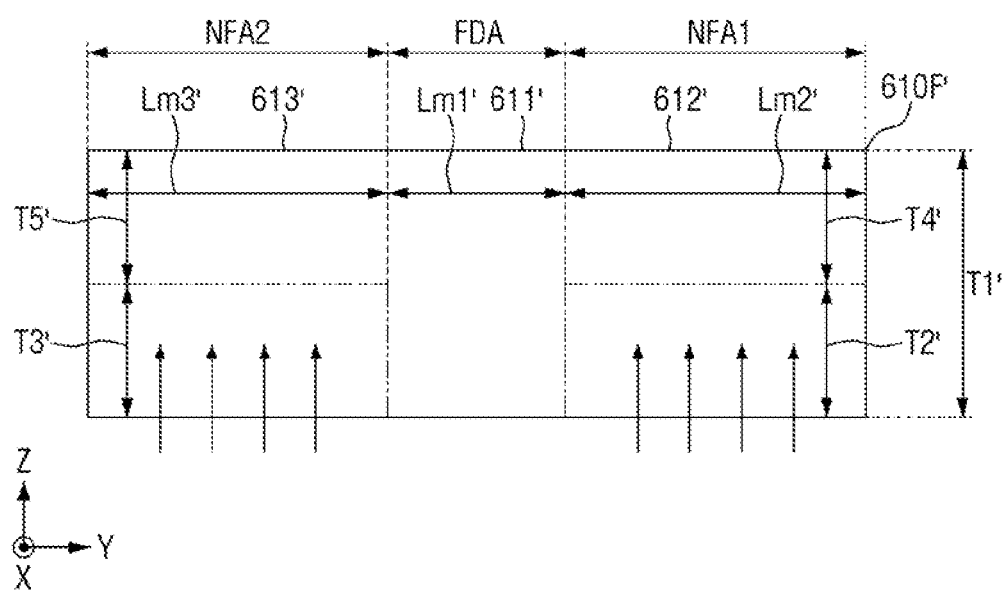
FIG. 23 is a side view of the metal plate of FIG. 21 for illustrating the method of fabricating the metal plate.

FIG. 21 is a perspective view illustrating an example of the step covering layer of FIG. 6. FIG. 22 is an exploded perspective view illustrating an example of the step covering layer of FIG. 6. FIG. 23 is a side view of the metal plate of FIG. 21 for illustrating the method of fabricating the metal plate.

The embodiment of FIGS. 21 and 22 is different from the embodiment of FIG. 10 in that the metal plate 610 has a T-shape by etching the rear surface of a metal plate having a first thickness T1' that overlaps the first non-folding area NFA1 and the second non-folding area NFA2, and that a first non-metal plate 621' is attached to the rear surface of a second metal plate 612' by an eighth adhesive member AD8' and a second non-metal plate 622' is attached to the rear surface of a third metal plate 613' by a ninth adhesive member AD9'. The following description will focus on the differences between the embodiment of FIGS. 21 and 22 and the embodiment of FIG. 10.

Referring to FIGS. 21 and 22, the front surface of a second metal plate 612' may be extended from the front surface of a first metal plate 611'. Therefore, the front surface of the second metal plate 612' and the front surface of the first metal plate 611' may be connected with each other to form a flat surface. For example, the front surface of the second metal plate 612' and the front surface of the first metal plate 611' may be coplanar.

The front surface of the third metal plate 613' may be extended from the front surface of the first metal plate 611'. Therefore, the front surface of the third metal plate 613' and the front surface of the first metal plate 611' may be connected with each other to form a flat surface. For example, the front surface of the third metal plate 612' and the front surface of the first metal plate 611' may be coplanar.

Since the second metal plate 612' has a fourth thickness T4' smaller than the first thickness T1', a part of one side surface of the first metal plate 611' may be exposed. Since the third metal plate 613' has a fifth thickness T5' smaller than the first thickness T1', a part of the opposite side surface of the first metal plate 611' may be exposed. For example, the lower part of the side and the lower part of the opposite side of the first metal plate 611' may be exposed. Accordingly, the side surface of the metal plate 610' may have a T-shape in which the first metal plate 611' protrudes downward from the second metal plate 612' and the third metal plate 613'.

The first non-metal plate 621' may be attached to the rear surface of the second metal plate 612' by the eighth adhesive member AD8', and the second non-metal plate 622' may be attached to the rear surface of the third metal plate 613' by the ninth adhesive member AD9'.

As shown in FIGS. 20 and 21, a step covering layer 600' may have a substantially constant thickness equal to the first thickness T1' across the folding area FDA, the first non-folding area NFA1 and the second non-folding area NFA2. Therefore, the front surface of the step covering layer 600' may be formed flat. Accordingly, when the step covering layer 600' is disposed on the digitizer layer 700 and the shielding member 800, the step covering layer 600' might not have an uneven shape even though the electrode patterns of the digitizer layer 700 have level differences. Therefore, the protective film 500 disposed on the step covering layer 600' does not have an uneven shape, either. Accordingly, it is possible to prevent an uneven shape of the protective film due to the level differences of the lines of the digitizer layer, and accordingly, possibly prevent the uneven shape from being recognized by the user on the front of the display device when high luminance light is illuminated to the front of the display device while no image is displayed thereon.

In addition, the thickness T4' of the second metal plate 612' and the thickness T5' of the third metal plate 613' are smaller than the thickness T1' of the first metal plate 611'. Therefore, it is possible to reduce the thickness of the metal plate 610' in the first non-folding area NFA1 and the second non-folding area NFA2, thereby reducing the attenuation of the magnetic field or electromagnetic signal emitted from the electronic pen by the metal plate 610'.

FIG. 23 is a side view of the metal plate for illustrating the method of fabricating the metal plate.

The embodiment of FIG. 23 is substantially identical to the embodiment of FIG. 12 except that a second metal plate 612' having a fourth thickness T4' is formed by etching out a part of the rear surface of a metal plate 610F' before etching, which overlaps the first non-folding area NFA1, by a second thickness T2', and a third metal plate 613' having a fifth thickness T5' is formed by etching out a part of the rear surface of the metal plate 610F', which overlaps the second non-folding area NFA2, by a third thickness T3'.

Figure 24:
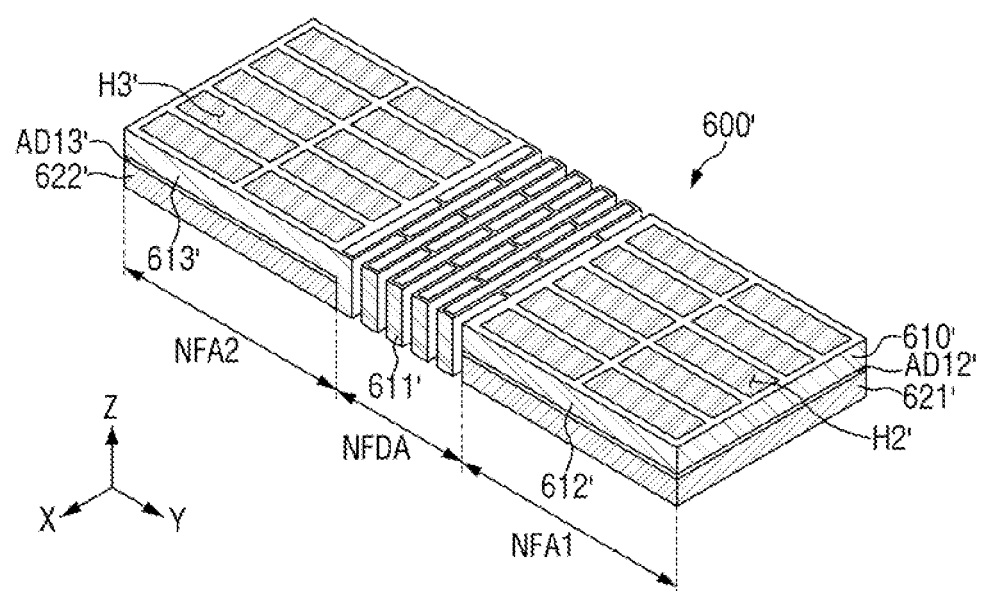
FIG. 24 is a perspective view illustrating the step covering layer of FIG. 6.
Figure 25:
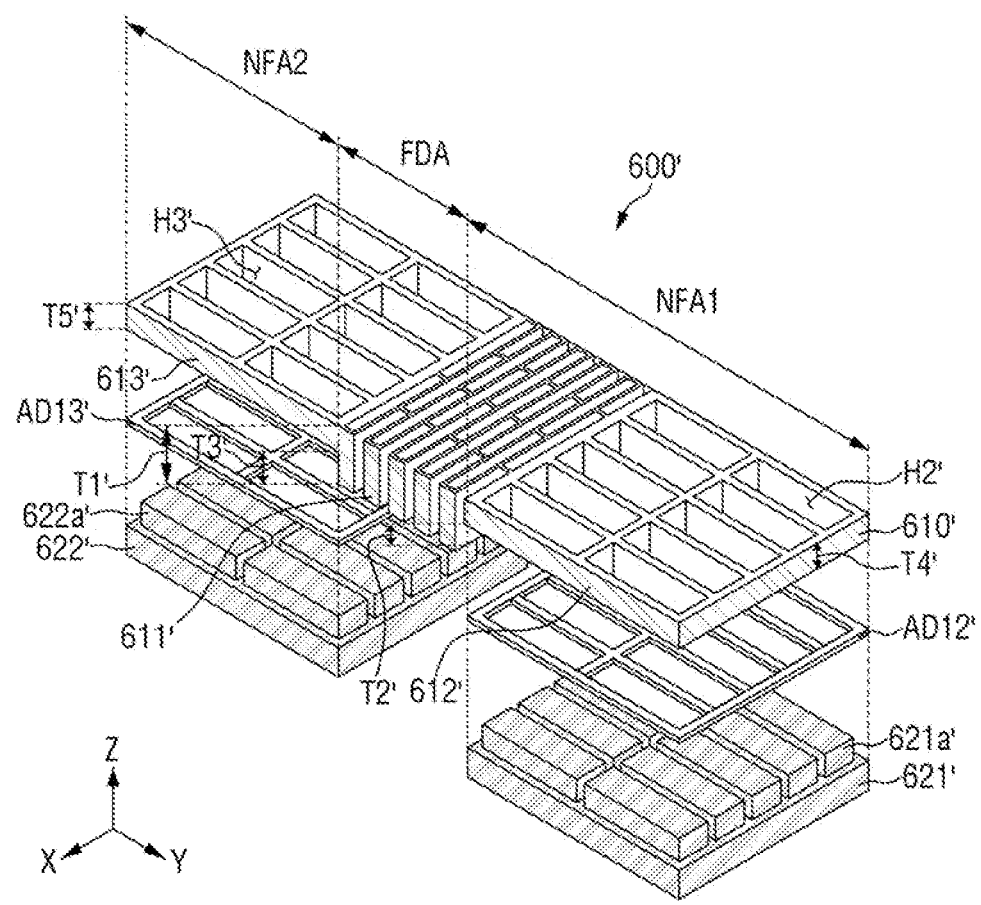
FIG. 25 is an exploded perspective view illustrating the step covering layer of FIG. 6.

FIG. 24 is a perspective view illustrating an example of the step covering layer of FIG. 6. FIG. 25 is an exploded perspective view illustrating an example of the step covering layer of FIG. 6.

The step covering layer 600' according to the embodiment of FIGS. 24 to 25 is different from the embodiment of FIGS. 21 and 22 in that it includes a twelfth adhesive member AD12' and a thirteenth adhesive member AD13'. In addition, a first non-metal plate 621' includes first protrusions 621a', and a second non-metal plate 622' includes second protrusions 622a'. The following description will focus on the differences between the embodiment of FIGS. 24 to 25 and the embodiment of FIGS. 21 and 22.

The twelfth adhesive member AD12' may be disposed between the first non-metal plate 621' and the second metal plate 612' and may have holes corresponding to the second holes H2' formed in the second metal plate 612', respectively.

The thirteenth adhesive member AD13' may be disposed between the second non-metal plate 622' and the third metal plate 613' and may have holes corresponding to the third holes H3' formed in the third metal plate 613', respectively.

The first non-metal plate 621' may include the first protrusions 621a' formed by insert injection molding using a frame including the holes corresponding to the second holes H2' formed in the second metal plate 612'. The second non-metal plate 622' may include the second protrusions 622a' formed by insert injection molding using a frame including the holes corresponding to the third holes H3' formed in the third metal plate 613'.

The first protrusions 621a' may be disposed on the front surface of the first non-metal plate 621' and may be in contact with the rear surface of the second metal plate 612'. For example, the first protrusions 621' may be formed integrally with the first non-metal plate 621'.

Likewise, the second protrusions 622a' may be disposed on the front surface of the second non-metal plate 622' and may be in contact with the rear surface of the third metal plate 613'. For example, the second protrusions 622a' may be formed integrally with the second non-metal plate 622'.

The width and length of each of the first protrusions 621a' and the second protrusions 622a' may be substantially identical to those described above with reference to FIG. 20.

Accordingly, as the first protrusions 621a'' and the second protrusions 622a' are inserted into the second holes H2' of the second metal plate 612 and the third holes H3' of the third metal plate 613', respectively, when the step covering layer 600' is folded, the step covering layer 600' overlapping the first non-folding area NFA1 and the second non-folding area NFA2 may not be easily stretched. As a result, the display panel 100 can be supported stably.

Figure 26:
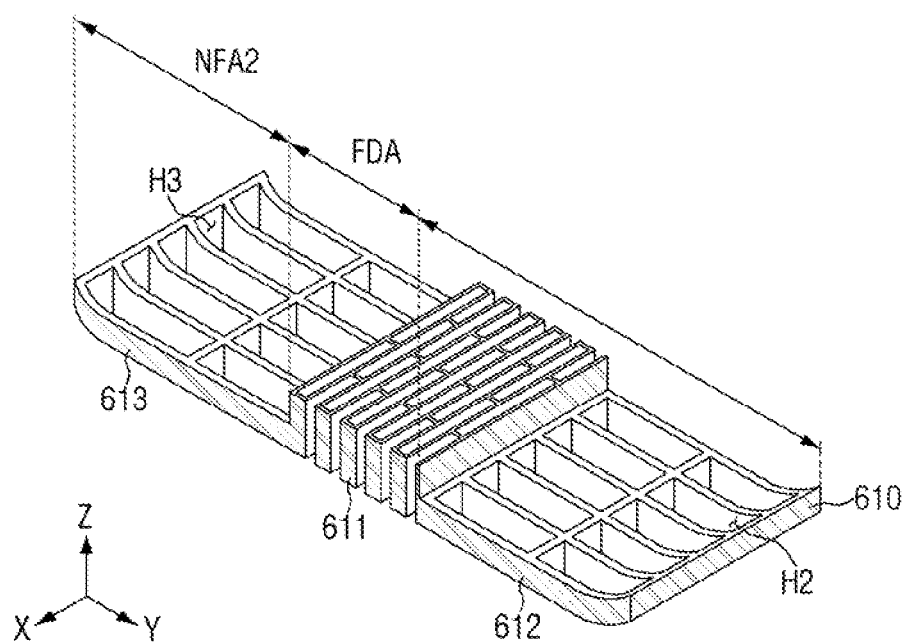
FIG. 26 is a perspective view illustrating a warpage issue that may occur while the cross section of a metal plate is etched.

FIG. 26 is a perspective view showing a warpage issue that may occur while the cross section of a metal plate is etched.

Referring to FIG. 26, in fabricating the metal plate 610, when only one surface thereof which overlaps the first non-folding area NFA1 and the second non-folding area NFA2 is etched out, for example, when only the front surface overlapping the first non-folding area NFA1 and the second non-folding area NFA2 is etched out to have the inverted T-shape, a warpage issue may arise.

As shown in FIG. 12, as a part of the front surface of the metal plate 610F is etched out, a second metal plate 612 and a third metal plate 613 may be formed. In this regard, internal stress may exist in the metal plate 610F before the etching. The internal stress existing on the front surface of the second metal plate 612 and the front surface of the third metal plate 613 can be relieved after the etching, whereas the internal stress may remain on the rear surface of the second metal plate 612 and the rear surface of the third metal plate 613. As a result, one edge of the second metal plate 612 and one edge of the third metal plate 613 of the metal plate 610 formed by the etching may be bent or warped toward the front side, e.g., a warpage issue may arise. When this happens, one edge of the first non-metal plate 621 and one edge of the second non-metal plate 622 disposed on the metal plate 610 may be bent or warped toward the front side as well.

In addition, as shown in FIG. 23, as a part of the rear surface of the metal plate 610F' is etched out, a second metal plate 612' and a third metal plate 613' may be formed. In this regard, internal stress may exist in the metal plate 610F'' before the etching. The internal stress existing on the rear surface of the second metal plate 612' and the rear surface of the third metal plate 613' can be relieved after the etching, whereas the internal stress may remain on the front surface of the second metal plate 612' and the front surface of the third metal plate 613'. As a result, one edge of the second metal plate 612' and one edge of the third metal plate 613' of the metal plate 610' formed by the etching may be bent or warped toward the rear side, e.g., a warpage issue may arise. When this happens, one edge of the first non-metal plate 621' and one edge of the second non-metal plate 622' disposed on the metal plate 610 may be bent or warped toward the rear side as well.

To suppress such a warpage issue, an embodiment according to the present invention will be described with reference to FIGS. 27 to 31, in which a metal plate 610 is fabricated by etching out the front surface and the rear surface, overlapping the first non-folding area NFA1 and the second non-folding area NFA2, of the metal plate 610.

Figure 27:
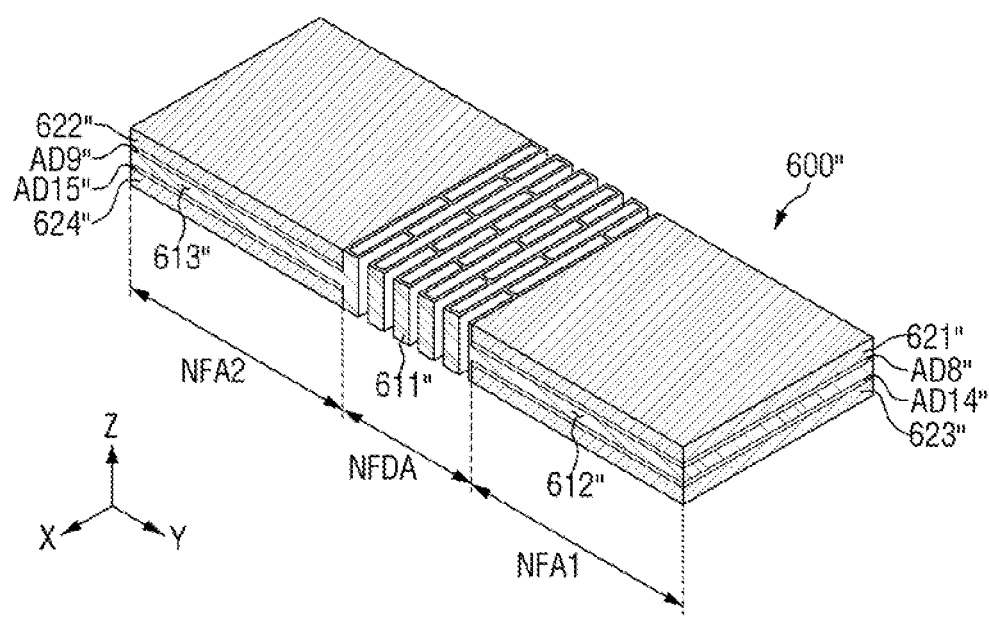
FIG. 27 is a perspective view illustrating the step covering layer of FIG. 6.
Figure 28:
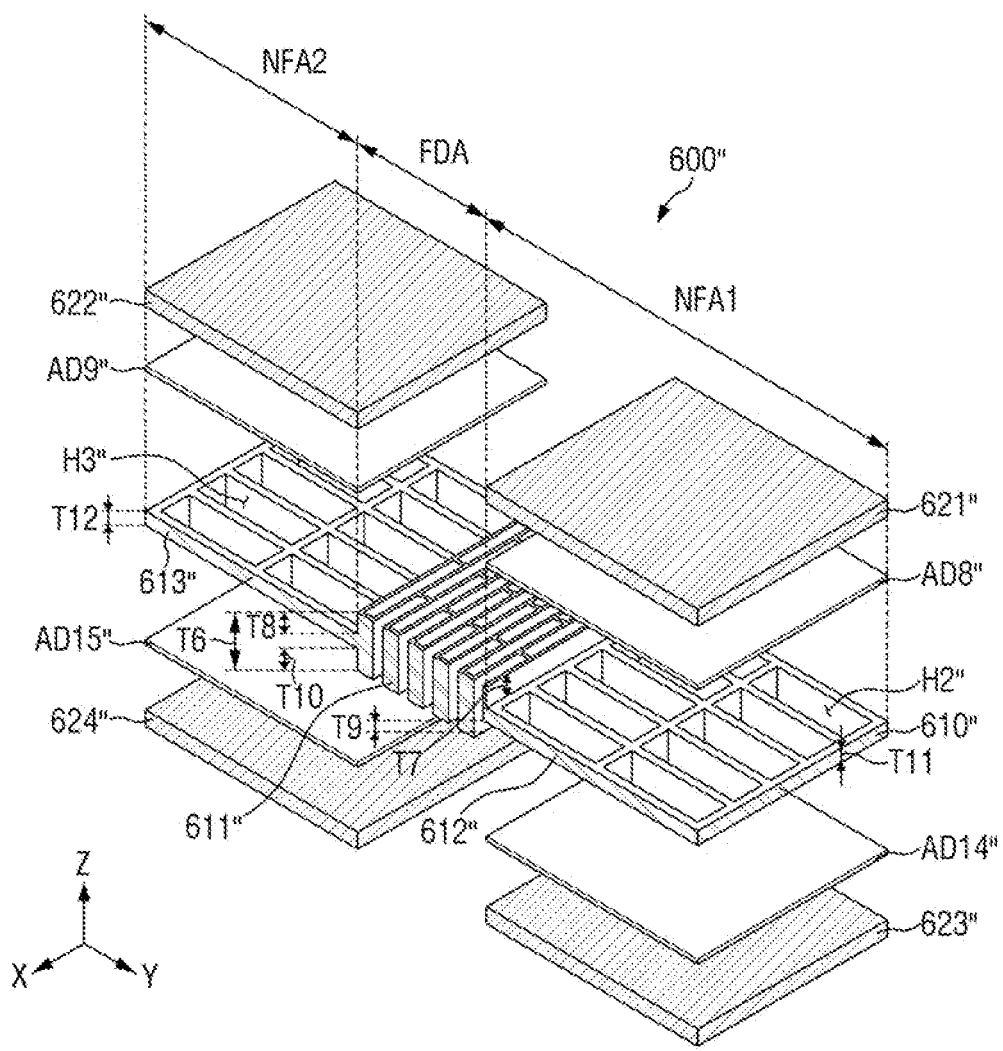
FIG. 28 is an exploded perspective view illustrating the step covering layer of FIG. 6.

FIG. 27 is a perspective view illustrating an example of the step covering layer of FIG. 6. FIG. 28 is an exploded perspective view illustrating an example of the step covering layer of FIG. 6.

The embodiment of FIGS. 27 and 28 is different from the embodiment of FIGS. 10 and 11 in that a metal plate 610" has a cross shape by etching out the front surface and the rear surface overlapping the first non-folding area NFA1 and the second non-folding area NFA2. The following description will focus on the difference between the embodiment of FIGS. 27 and 28 and the embodiment of FIGS. 10 and 11.

Referring to FIGS. 27 and 28, a step covering layer 600" according to an embodiment of the present invention may include a metal plate 610", a first non-metal plate 621", a second non-metal plate 622", a third non-metal plate 623", a fourth non-metal plate 624", an eighth adhesive member AD8", a ninth adhesive member AD9", a fourteenth adhesive member AD14" and a fifteenth adhesive member AD15". The metal plate 610" may include a first metal plate 611", a second metal plate 612", and a third metal plate 613".

The first metal plate 611" is substantially identical to that described above with reference to FIGS. 10 and 11; and, therefore, the redundant descriptions will be omitted.

Since the second metal plate 612" has an eleventh thickness T11 smaller than the sixth thickness T6, a part of one side surface of the first metal plate 611" may be exposed. Since the third metal plate 613" has a twelfth thickness T12 smaller than the sixth thickness T6, a part of the opposite side surface of the first metal plate 611" may be exposed. For example, the upper part and the lower part of the side of the first metal plate 611" may be exposed and the upper part and the lower part of the opposite side of the first metal plate 611" may be exposed. For example, the second metal plate 612" may protrude from the central area of the side of the first metal plate 611". For example, the third metal plate 613" may protrude from the central area of the opposite side of the first metal plate 611". Therefore, the side surface of the metal plate 610" may have the cross shape in which the first metal plate 611" protrudes upward and downward from the second metal plate 612" and the third metal plate 613".

The first non-metal plate 621" may be attached to the front surface of the second metal plate 612" by the eighth adhesive member AD8", and the second non-metal plate 622" may be attached to the front surface of the third metal plate 613" by the ninth adhesive member AD9". The third non-metal plate 623" may be attached to the rear surface of the second metal plate 612" by the fourteenth adhesive member AD14", and the fourth non-metal plate 622" may be attached to the rear surface of the third metal plate 613" by the fifteenth adhesive member AD15". The eighth adhesive member AD8", the ninth adhesive member AD9", the fourteenth adhesive member AD14" and the fifteenth adhesive member AD15" may be, for example, pressure sensitive adhesives.

In the first non-folding area NFA1, the sum of the thickness T11 of the second metal plate 612", the thickness of the eighth adhesive member AD8", the thickness of the first non-metal plate 621", the thickness of the fourteenth adhesive member AD14" and the thickness of the third non-metal plate 623" may be substantially equal to the thickness T6 of the first metal plate 611". For example, the sum of the thickness of the eighth adhesive member AD8" and the thickness of the first non-metal plate 621" in the first non-folding area NFA1 may be substantially equal to the thickness T7 of the exposed side surface of the first metal plate 611". The sum of the thickness of the fourteenth adhesive member AD14" and the thickness of the third non-metal plate 623" in the first non-folding area NFA1 may be substantially equal to the thickness T9 of the exposed side surface of the first metal plate 611".

In the second non-folding area NFA2, the sum of the thickness T12 of the third metal plate 613", the thickness of the ninth adhesive member AD9", the thickness of the second non-metal plate 622", the thickness of the fifteenth adhesive member AD15" and the thickness of the fourth non-metal plate 624" may be substantially equal to the thickness T6 of the first metal plate 611". For example, the sum of the thickness of the ninth adhesive member AD9" and the thickness of the second non-metal plate 622" in the second non-folding area NFA2 may be substantially equal to the thickness T8 of the exposed opposite side surface of the first metal plate 611". The sum of the thickness of the fifteenth adhesive member AD15" and the thickness of the fourth non-metal plate 624" in the second non-folding area NFA2" may be substantially equal to the thickness T10 of the exposed opposite side surface of the first metal plate 611".

The step covering layer 600" may have substantially the constant thickness equal to the sixth thickness T6 across the folding area FDA, the first non-folding area NFA1 and the second non-folding area NFA2. Therefore, the front surface of the step covering layer 600" may be formed flat. Accordingly, when the step covering layer 600" is disposed on the digitizer layer 700 and the shielding member 800, the step covering layer 600" might not have an uneven shape even though the electrode patterns 700 of the digitizer layer 700 have level differences. Therefore, the protective film 500 disposed on the step covering layer 600" does not have an uneven shape, either. Accordingly, it is possible to prevent an uneven shape of the protective film due to the level differences of the lines of the digitizer layer, and accordingly, possibly prevent the uneven shape from being recognized by the user on the front of the display device when high luminance light is illuminated to the front of the display device while no image is displayed thereon.

In addition, the thickness T11 of the second metal plate 612" and the thickness T12 of the third metal plate 613" are smaller than the thickness T6 of the first metal plate 611. Therefore, it is possible to reduce the thickness of the metal plate 610" in the first non-folding area NFA1 and the second non-folding area NFA2, thereby reducing the attenuation of the magnetic field or electromagnetic signal emitted from the electronic pen by the metal plate 610".

Figure 29:
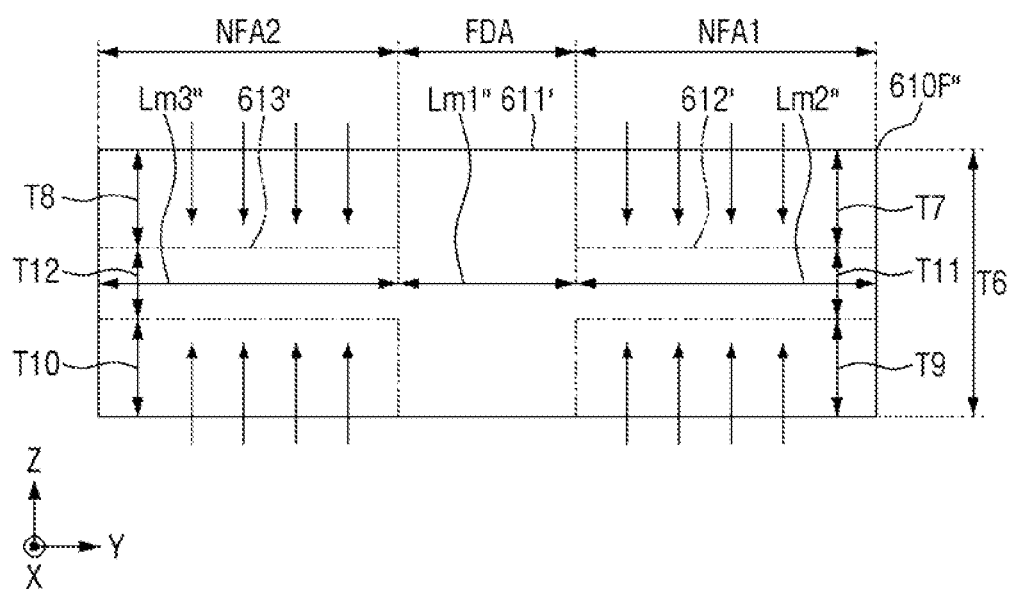
FIG. 29 is a side view of the metal plate of FIG. 27 for illustrating the method of fabricating the metal plate.

FIG. 29 is a side view of the metal plate of FIG. 27 for illustrating the method of fabricating the metal plate.

The embodiment of FIG. 29 is different from the embodiment of FIG. 12 in that the second metal plate 612" having the eleventh thickness T11 is formed by etching out the front surface of a metal plate 610F" having the sixth thickness T6 before etching by the seventh thickness T7 and the rear surface thereof by the ninth thickness T9, which overlap the first non-folding area NFA1, and the third metal plate 613" having the twelfth thickness T12 is formed by etching out the front surface by the eighth thickness T8 and the rear surface thereof by the tenth thickness T10, which overlap the second non-folding area NFA2. The following description will focus on the differences between the embodiment of FIG. 29 and the embodiment of FIG. 12.

The thickness T11 of the second metal plate 612" may be substantially equal to the thickness T4 of the second metal plate 612 according to the embodiment of FIG. 12. The thickness T12 of the third metal plate 613" may be substantially equal to the thickness T5 of the third metal plate 613 according to the embodiment of FIG. 12.

The seventh thickness T7, by which the front surface of the metal plate 610F" overlapping the first non-folding area NFA1 is etched out, may be less than the second thickness T2 by which the front surface of the metal plate 610F overlapping the first non-folding area NFA1 is etched out according to the embodiment of FIG. 12. The ninth thickness T9, by which the rear surface of the metal plate 610F" overlapping the first non-folding area NFA1 is etched out, may be less than the second thickness T2 by which the front surface of the metal plate 610F overlapping the first non-folding area NFA1 is etched out according to the embodiment of FIG. 12.

The eighth thickness T8, by which the front surface of the metal plate 610F" overlapping the second non-folding area NFA1 is etched out, may be less than the third thickness T3 by which the front surface of the metal plate 610F overlapping the second non-folding area NFA2 is etched out according to the embodiment of FIG. 12. The tenth thickness T10, by which the rear surface of the metal plate 610F" overlapping the second non-folding area NFA2 is etched out, may be less than the third thickness T3 by which the front surface of the metal plate 610F overlapping the second non-folding area NFA2 is etched out according to the embodiment of FIG. 12.

The seventh thickness T7, by which the front surface of the metal plate 610F" overlapping the first non-folding area NFA1 is etched out, may be substantially equal to the ninth thickness T9 by which the rear surface of the metal plate 610F" overlapping the first non-folding area NFA1 is etched out. According to an embodiment of the present invention, the difference between the seventh thickness T7 and the ninth thickness T9 may be equal to or less than about 5 μm.

If the difference between the seventh thickness T7 and the ninth thickness T9 is larger than about 5 μm, there may be a difference between the amount of the internal stress relieved on the front surface of the second metal plate 612" and the amount of the internal stress relieved on the rear surface of the second metal plate 612" among the internal stress existing in the metal plate 610F" before the etching. As a result, the internal stress is not equally relieved between the front surface and rear surface of the metal plate overlapping the first non-folding area NFA1, and thus the warpage issue may occur.

The eighth thickness T8, by which the front surface of the metal plate 610F" overlapping the second non-folding area NFA2 is etched out, may be substantially equal to the tenth thickness T10 by which the rear surface of the metal plate 610F" overlapping the second non-folding area NFA2 is etched out. According to an embodiment of the present invention, the difference between the eighth thickness T8 and the tenth thickness T10 may be equal to or less than about 5 μm.

If the difference between the eighth thickness T8 and the tenth thickness T10 is larger than about 5 μm, there may be a difference between the amount of the internal stress relieved on the front surface of the third metal plate 613" and the amount of the internal stress relieved on the front surface of the third metal plate 613" among the internal stress existing in the metal plate 610F" before the etching. As a result, the internal stress is not equally relieved between the front surface and rear surface of the metal plate overlapping the second non-folding area NFA2, and thus the warpage issue may occur.

Figure 30:
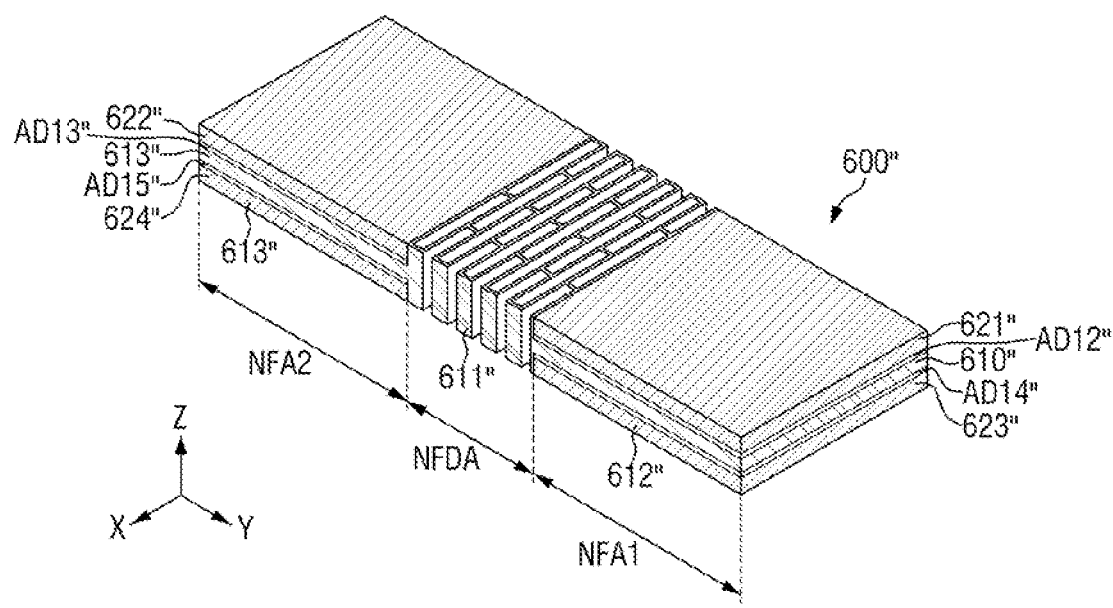
FIG. 30 is a perspective view illustrating the step covering layer of FIG. 6.
Figure 31:
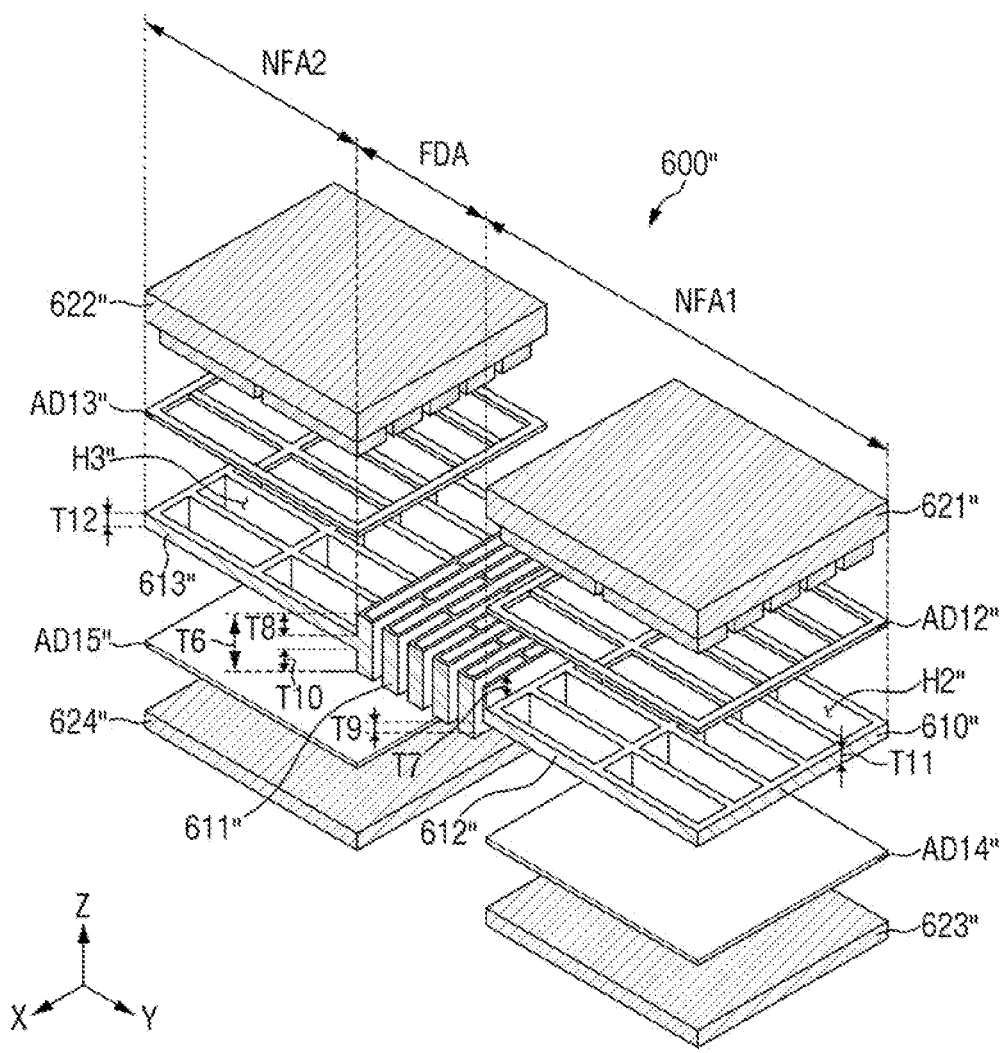
FIG. 31 is an exploded perspective view illustrating the step covering layer of FIG. 6.

FIG. 30 is a perspective view illustrating an example of the step covering layer of FIG. 6. FIG. 31 is an exploded perspective view illustrating an example of the step covering layer of FIG. 6.

The embodiment of FIGS. 30 to 31 is different from the embodiment of FIGS. 27 to 29 in that a first non-metal plate 621" of a step covering layer 600" includes first protrusions 621a", and a second non-metal plate 622" thereof includes second protrusions 622a".

The first non-metal plate 621" including the first protrusions 621a", the second non-metal plate 622" including the second protrusions 622a", a twelfth adhesive member AD12" disposed between the first non-metal plate 621" and the second metal plate 612", and the thirteenth adhesive member AD13" disposed between the second non-metal plate 621" and the third metal plate 613" may be substantially identical to those described above with reference to FIGS. 18 to 20; and, therefore, the redundant descriptions will be omitted.

According to the embodiment of FIGS. 30 and 31, the first protrusions 621a" may be formed on the rear surface of the first non-metal plate 621" and the second protrusions 622a" may be formed on the rear surface of the second non-metal plate 622". It is to be noted that according to an embodiment of the present invention, the first protrusions 621a" may be formed on the front surface of the third non-metal plate 623", and the second protrusions 622a" may be formed on the front surface of the fourth non-metal plate 624".

While the present invention has been described with reference to the embodiments thereof, it will be understood by those of ordinary skill in the art that various changes in form and detail may be made thereto without departing from the spirit and scope of the present invention.

What is claimed is:

1. A display device comprising:
    a display panel comprising a folding area and a first non-folding area extended from a first folding line located on a first side of the folding area;
    a digitizer layer disposed on the display panel and comprising electrode patterns; and
    a step covering layer disposed between the display panel and the digitizer layer, wherein the step covering layer comprises a first metal plate, a second metal plate, and a first non-metal plate, wherein the first metal plate overlaps the folding area,
    wherein the second metal plate overlaps the first non-folding area, and
    wherein the first non-metal plate overlaps the first non-folding area and is disposed on a first surface of the second metal plate.

2. The display device of claim 1, wherein a thickness of the second metal plate is smaller than a thickness of the first metal plate.

3. The display device of claim 2, wherein the thickness of the second metal plate is about 20% to about 70% of the thickness of the first metal plate.

4. The display device of claim 3, wherein the first non-metal plate is disposed between the display panel and the second metal plate.

5. The display device of claim 3, wherein a thickness of the step covering layer is constant across the folding area and the first non-folding area.

6. The display device of claim 1, wherein the first metal plate comprises a plurality of bars overlapping the folding area.

7. The display device of claim 6, wherein the first metal plate comprises a slit formed between adjacent ones of the plurality of bars.

8. The display device of claim 7, wherein a width of each of the plurality of bars in a direction is smaller than or equal to a width of the slit in the direction.

9. The display device of claim 1, wherein the first metal plate comprises a plurality of first holes overlapping the folding area, and
wherein the second metal plate comprises a plurality of second holes overlapping the first non-folding area.

10. The display device of claim 9, wherein a direction in which the plurality of first holes is extended is different from a direction in which the plurality of second holes is extended.

11. The display device of claim 10, wherein the direction in which the plurality of first holes is extended is parallel to a direction in which the first folding line is extended, and
wherein the direction in which the plurality of second holes is extended is substantially perpendicular to the direction in which the first folding line is extended.

12. The display device of claim 1, wherein the second metal plate comprises a plurality of second holes overlapping the first non-folding area, and
wherein the first non-metal plate comprises first protrusions disposed in the plurality of second holes of the second metal plate, respectively.

13. The display device of claim 1, wherein the display panel further comprises a second non-folding area extended from a second folding line located on a second side of the folding area opposite to the first side of the folding area, and
wherein the step covering layer comprises:
a third metal plate overlapping the second non-folding area, and
a second non-metal plate overlapping the second non-folding area and disposed on a first surface of the third metal plate.

14. The display device of claim 13, wherein a thickness of the third metal plate is smaller than a thickness of the first metal plate.

15. The display device of claim 13, wherein a thickness of the first non-metal plate is equal to a thickness of the second non-metal plate.

16. The display device of claim 13, wherein the third metal plate comprises a plurality of third holes overlapping the second non-folding area, and
wherein the second non-metal plate comprises second protrusions disposed in the plurality of third holes of the third metal plate, respectively.

17. The display device of claim 13, wherein the step covering layer comprises a third non-metal plate overlapping the first non-folding area and disposed on a second surface of the second metal plate opposite to the first surface of the second metal plate.

18. The display device of claim 17, wherein the step covering layer comprises a fourth non-metal plate overlapping the second non-folding area and disposed on a second surface of the third metal plate opposite to the first surface of the third metal plate.

19. The display device of claim 1, wherein the first non-metal plate is disposed between the display panel and the digitizer layer.

20. A display device comprising:
a display panel displaying an image;
a digitizer layer disposed on a rear surface of the display panel and comprising electrode patterns; and
a step covering layer disposed between the display panel and the digitizer layer,
wherein the step covering layer comprises:
a metal plate, and
a non-metal plate disposed on at least a part of a surface of the metal plate, and
wherein a first thickness of the metal plate is larger than a first thickness of the non-metal plate.

21. The display device of claim 20, wherein an upper surface of the metal plate and an upper surface of the non-metal plate are substantially coplanar.

* * * * *